United States Patent
Oda et al.

(10) Patent No.: US 12,202,965 B2
(45) Date of Patent: Jan. 21, 2025

(54) BLOCK COPOLYMER COMPOSITION FOR FLEXOGRAPHIC PLATE

(71) Applicant: ZEON CORPORATION, Tokyo (JP)

(72) Inventors: Ryoji Oda, Tokyo (JP); Daisuke Kato, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 1121 days.

(21) Appl. No.: 16/981,279

(22) PCT Filed: Mar. 19, 2019

(86) PCT No.: PCT/JP2019/011528
§ 371 (c)(1),
(2) Date: Sep. 16, 2020

(87) PCT Pub. No.: WO2019/188604
PCT Pub. Date: Oct. 3, 2019

(65) Prior Publication Data
US 2021/0040308 A1    Feb. 11, 2021

(30) Foreign Application Priority Data
Mar. 28, 2018   (JP) .................. 2018-062955

(51) Int. Cl.
C08L 53/02 (2006.01)
B41N 1/12 (2006.01)
C08L 51/00 (2006.01)
G03F 7/033 (2006.01)

(52) U.S. Cl.
CPC .............. C08L 53/02 (2013.01); B41N 1/12 (2013.01); C08L 51/006 (2013.01); G03F 7/033 (2013.01)

(58) Field of Classification Search
None
See application file for complete search history.

(56) References Cited

U.S. PATENT DOCUMENTS

2002/0001775 A1   1/2002   Knoll
2006/0263715 A1*  11/2006  Tsubaki .................. G03F 7/033
                                                         430/270.1
2011/0257337 A1*  10/2011  Oda ....................... C09J 153/02
                                                         525/98
2011/0308412 A1*  12/2011  Matsubara .............. C08L 53/02
                                                         525/89
2015/0175855 A1*   6/2015  Nakajima ........... C08F 297/044
                                                         524/505

FOREIGN PATENT DOCUMENTS

| EP | 1473595 A1 | 11/2004 | |
| EP | 2264101 A1 * | 12/2010 | ................ C08J 5/18 |
| EP | 2415846 A1 * | 2/2012 | ............ C09J 153/02 |
| EP | 3677608 A1 | 7/2020 | |
| JP | 2002072457 A | 3/2002 | |
| JP | 2006104359 A | 4/2006 | |
| JP | 2006514338 A | 4/2006 | |
| JP | 2010202716 A * | 9/2010 | |
| JP | 2014157191 A * | 8/2014 | |
| JP | 2016069565 A * | 5/2016 | |
| JP | 2017190428 A * | 10/2017 | |
| WO | 2005031459 A1 | 4/2005 | |
| WO | WO-2018168647 A1 * | 9/2018 | ............... B41N 1/12 |
| WO | 2019044369 A1 | 3/2019 | |

OTHER PUBLICATIONS

May 28, 2019, International Search Report issued in the International Patent Application No. PCT/JP2019/011528.
Sep. 29, 2020, International Preliminary Report on Patentability issued in the International Patent Application No. PCT/JP2019/011528.

* cited by examiner

Primary Examiner — Martin J Angebranndt
(74) Attorney, Agent, or Firm — KENJA IP LAW PC

(57) ABSTRACT

The present disclosure provides a block copolymer composition for a flexographic plate comprising a block copolymer A represented by the following general formula (A) and a block copolymer B represented by the following general formula (B), wherein: a content of aromatic vinyl monomer units relative to all monomer units constituting polymer components of the block copolymer composition for the flexographic plate is 18% to 70% by mass; a type A hardness is 25 to 65; and an anisotropic index is 2.0 or less.

5 Claims, No Drawings

BLOCK COPOLYMER COMPOSITION FOR FLEXOGRAPHIC PLATE

TECHNICAL FIELD

The present invention relates to a block copolymer composition for a flexographic plate comprising a block copolymer composition composed of a block copolymer including a conjugated diene polymer block and an aromatic vinyl polymer block. In more specific, the present invention relates to a block copolymer composition for a flexographic plate having excellent flexibility and small anisotropy, with which a flexographic plate having high definition printing properties and excellent ink-swelling resistance and abrasion resistance can be provided.

BACKGROUND ART

Flexographic printing has been broadly used as a printing method for materials such as a label, a plastic container, a carton, a plastic bag, a box, and an envelope. As a flexographic plate used for this flexographic printing, the one frequently used is formed by exposing a photosensitive composition for a flexographic plate comprising an elastomer, a polymerizable ethyleny unsaturated monomer, and a photopolymerization initiator.

The photosensitive composition for a flexographic plate is usually formed in a sheet shape, supplied as a sheet having a multi-layered structure wherein a flexible sheet as a supporting body is arranged on one surface and a protective film is arranged on the other surface. Light is irradiated to this multi-layered sheet from the supporting body side to cure a specified thickness of the photosensitive composition layer for a flexographic plate. Next, the protective film is peeled off and a negative film is adhered to that surface, and then light is irradiated from above the said negative film. The part of the photosensitive composition for a flexographic plate where the light has been transmitted is cured, and the part not cured are removed by substance such as an organic solvent and an aqueous solvent. In this manner, a flexographic plate having a concave and convex structure is formed.

As an elastomer used to constitute the photosensitive composition for a flexographic plate, a variety of thermoplastic elastomers having excellent workability have been broadly used. Among them, an aromatic vinyl-conjugated diene-aromatic vinyl block copolymer such as a styrene-isoprene-styrene block copolymer (SIS) and a styrene-butadiene-styrene block copolymer (SBS) has been used approvingly as an elastomer for constituting the photosensitive composition for a flexographic plate, since the said copolymer has high rubber elasticity, and flexibility and impact resilience suitable for constituting a flexographic plate. In addition, properties such as abrasion resistance and ink-swelling resistance are also required for the photosensitive composition for a flexographic plate in order to allow high definition printing. For that reason, various researches have been conducted to improve the aromatic vinyl-conjugated diene-aromatic vinyl block copolymer used for constituting the photosensitive composition for a flexographic plate.

For example, Patent Literature 1 discloses: a photosensitive block copolymer for a printing plate material comprising an aromatic vinyl-conjugated diene block copolymer, wherein an aromatic vinyl compound content is 10 to 40 mass %, a toluene insoluble is 30 ppm or less, a type A hardness is 85 or less, and a vinyl bond content in a conjugated diene polymer block is 50% or less; and a photosensitive block copolymer composition for a printing plate material and a photosensitive elastomer composition including the above described photosensitive block copolymer for a printing plate material. It is described that the said photosensitive block copolymer for a printing plate material has a small amount of gel and excellent in process stability, image developing properties and printing properties.

In addition, Patent Literature 2 discloses a photopolymerizable composition for a flexographic plate including a mixture of SIS and SBS. It is described that this photopolymerizable composition has high abrasion resistance, and is excellent in flexibility not having excessive hardness. It is also described that the said photopolymerizable composition does not express anisotropy caused by molecular orientation which occurs during a melt process; thus, negative effects to printing that occur when a flexographic plate formed by a material including anisotropy is used may be avoided.

In addition, Patent Literature 3 discloses a photopolymerizable composition for a flexographic plate including an aromatic vinyl-conjugated diene-aromatic vinyl block copolymer wherein a conjugated diene polymer block is a random copolymer block of isoprene and butadiene. It is described that the said photopolymerizable composition is excellent in transparency.

Further, Patent Literature 4 discloses a block copolymer composition for a flexographic plate including a three-branched-type aromatic vinyl-conjugated diene block copolymer obtained by using a specified coupling agent. The said block copolymer composition for a flexographic plate when constituting a flexographic plate is excellent in smoothness and flow resistance (properties not easily deformed before curing by being exposed to light), and reproductivity of fine lines.

However, it has been difficult to obtain a composition having well-balanced properties such as abrasion resistance and flexibility, even when the compositions described in Patent Literatures 1 to 4 are used.

In other words, it has been known that the properties such as abrasion resistance of the aromatic vinyl-conjugated diene-aromatic vinyl block copolymer may be improved by increasing the proportion of an aromatic vinyl monomer unit included therein to increase mechanical strength. However, there has been a problem that the polymer loses rubber elasticity when the proportion of the aromatic vinyl monomer unit is increased to a level with which sufficient abrasion resistance for use as a flexographic plate is obtained.

CITATION LIST

Patent Literatures

Patent Literature 1: Japanese Patent Application Laid-Open (JP-A) No. 2006-104359
Patent Literature 2: JP-A No. 2002-072457
Patent Literature 3: Japanese Unexamined Patent Publication No. 2006-514338
Patent Literature 4: WO2005/031459

SUMMARY OF INVENTION

Technical Problem

The object of the present invention is to provide a block copolymer composition for a flexographic plate having excellent flexibility and small anisotropy, that can provide a flexographic plate having high definition printing properties and excellent ink-swelling resistance and abrasion resistance.

Solution to Problem

The inventors of the present invention conducted a thorough investigation in order to achieve the object described above, and as a result, they found that, with a block copolymer composition including two kinds of block copolymers comprising a conjugated diene polymer block and an aromatic vinyl polymer block respectively having a specified structure, wherein a type A hardness and an anisotropic index are in specified ranges, the balance of abrasion resistance and rubber elasticity is excellent even when the proportion of the aromatic vinyl monomer unit is increased. Moreover, the block copolymer composition has excellent crosslinking properties and small anisotropy; thus, a flexographic plate having high definition printing properties and excellent ink-swelling resistance and abrasion resistance may be obtained using the said block copolymer composition. The present invention has been completed based on these findings.

Thus, according to the present invention, there is provided a block copolymer composition for a flexographic plate, comprising a block copolymer A represented by the following general formula (A) and a block copolymer B represented by the following general formula (B), wherein: a content of aromatic vinyl monomer units relative to all monomer units constituting polymer components of the block copolymer composition for the flexographic plate is 18% to 70% by mass; a type A hardness is 25 to 65; and an anisotropic index is 2.0 or less.

$$Ar1^a\text{-}D^a\text{-}Ar2^a \tag{A}$$

$$(Ar^b\text{-}D^b)_n\text{-}X \tag{B}$$

(In the general formula (A) and the general formula (B), $Ar1^a$ and $Ar^b$ each represent an aromatic vinyl polymer block having a weight average molecular weight of 6,000 to 20,000; $Ar2^a$ represents an aromatic vinyl polymer block having a weight average molecular weight of 25,000 to 400,000, a ratio $(Mw(Ar2^a)/Mw(Ar1^a))$ of the weight average molecular weight of $Ar2^a$ and the weight average molecular weight of $Ar1^a$ is 2 to 20; $D^a$ and $D^b$ each represent a conjugated diene polymer block having a vinyl bond content of 21% to 70% by mol; X represents a single bond or a residue of coupling agent; and n represents an integer of 2 or more.)

It is preferable that, in the block copolymer composition for a flexographic plate, the content of aromatic vinyl monomer units relative to all monomer units constituting polymer components of the block copolymer composition for the flexographic plate is 20% to 70% by mass.

It is preferable that, in the block copolymer composition for a flexographic plate, a mass ratio (A/B) of the block copolymer A and the block copolymer B is 36/64 to 85/15.

It is preferable that, the block copolymer composition for a flexographic plate further comprises a block copolymer C represented by the following general formula (C).

$$Ar^c\text{-}D^c \tag{C}$$

(In the general formula (C), $Ar^c$ represents an aromatic vinyl polymer block having a weight average molecular weight of 6,000 to 20,000, and $D^c$ represents a conjugated diene polymer block having a vinyl bond content of 21% to 70% by mol.)

It is preferable that, in the block copolymer composition for a flexographic plate, the block copolymer B is obtained by using a compound including two or more of at least one kind of functional group selected from an alkoxyl group, an ester group and an epoxy group in one molecule as a coupling agent.

Also, according to the present invention, there is provided a photosensitive composition for a flexographic plate comprising the above described block copolymer composition for a flexographic plate, an ethyleny unsaturated compound having a molecular weight of 5,000 or less, and a photopolymerization initiator.

Further, according to the present invention, there is provided a flexographic plate comprising the above described photosensitive composition for a flexographic plate.

In addition, according to the present invention, there is provided a method for producing the above described block copolymer composition for a flexographic plate, the method comprising: a first step of forming an aromatic vinyl polymer including an active terminal by polymerizing an aromatic vinyl monomer using a polymerization initiator in a solvent; a second step of forming an aromatic vinyl-conjugated diene block copolymer including an active terminal by adding a conjugated diene monomer to a solution obtained in the first step for polymerization; a third step of forming a block copolymer B by adding, as a coupling agent, a compound including two or more of at least one kind of functional group selected from an alkoxyl group, an ester group and an epoxy group in one molecule, to a solution obtained in the second step, in an amount the functional group relative to the active terminal is less than one equimolar amount; a fourth step of forming a block copolymer A by adding an aromatic vinyl monomer to a solution obtained in the third step for polymerization; and a fifth step of collecting the block copolymer composition for the flexographic plate from a solution obtained in the fourth step; wherein reactions in at least the second step, the third step, and the fourth step are conducted under the presence of a Lewis base compound, and an amount of the Lewis base compound per 1 mol of the active terminal in the polymerization initiator is 0.1 to 50 mol.

Advantageous Effects of Invention

According to the present invention, a block copolymer composition for a flexographic plate having excellent flexibility and small anisotropy that can provide a flexographic plate having high definition printing properties and excellent ink-swelling resistance and abrasion resistance may be obtained.

DESCRIPTION OF EMBODIMENTS

The block copolymer composition for a flexographic plate and the production method therefor, the photosensitive composition for a flexographic plate as well as the flexographic plate of the present invention will be hereinafter described.

A. Block Copolymer Composition for Flexographic Plate

The block copolymer composition for a flexographic plate of the present invention comprises at least two kinds of block copolymers. One of the two kinds of bloc copolymers constituting the block copolymer for a flexographic plate of the present invention, the block copolymer A is an aromatic vinyl-conjugated diene-aromatic vinyl block copolymer, represented by the following general formula (A), including two of aromatic vinyl polymer blocks respectively having different weight average molecular weight from each other.

$$Ar1^a\text{-}D^a\text{-}Ar2^a \quad\quad\quad (A)$$

In the above general formula (A), $Ar1^a$ represents an aromatic vinyl polymer block having a weight average molecular weight of 6,000 to 20,000; $Ar2^a$ represents an aromatic vinyl polymer block having a weight average molecular weight of 25,000 to 400,000, a ratio ($Mw(Ar2^a)$/$Mw(Ar1^a)$) of the weight average molecular weight of $Ar2^a$ and the weight average molecular weight of $Ar1^a$ is 2 to 20; and $D^a$ represents a conjugated diene polymer block having a vinyl bond content of 21% to 70% by mol.

Also, the other of the two kinds of bloc copolymers constituting the block copolymer for a flexographic plate of the present invention, the block copolymer B is an aromatic vinyl-conjugated diene-aromatic vinyl block copolymer represented by the following general formula (B).

$$(Ar^b\text{-}D^b)_n\text{-}X \quad\quad\quad (B)$$

In the above general formula (B), $Ar^b$ represents an aromatic vinyl polymer block having a weight average molecular weight of 6,000 to 20,000; $D^b$ represents a conjugated diene polymer block having a vinyl bond content of 21% to 70% by mol; X represents a single bond or a residue of coupling agent; and n represents an integer of 2 or more.

The block copolymer composition for a flexographic plate of the present invention may further comprise a block copolymer C, that is an aromatic vinyl-conjugated diene block copolymer represented by the following general formula (C), in addition to the block copolymer A and the block copolymer B.

$$Ar^c\text{-}D^c \quad\quad\quad (C)$$

In the above general formula (C), $Ar^c$ represents an aromatic vinyl polymer block having a weight average molecular weight of 6,000 to 20,000, and $D^c$ represents a conjugated diene polymer block having a vinyl bond content of 21% to 70% by mol.

The aromatic vinyl polymer blocks ($Ar1^a$, $Ar2^a$, $Ar^b$, and $Ar^c$) in the block copolymers A to C are respectively a polymer block formed from an aromatic vinyl monomer unit. There are no particular limitations on the aromatic vinyl monomer used to constitute the aromatic vinyl monomer unit of the aromatic vinyl polymer blocks, and examples thereof may include styrene, α-methylstyrene, 2-methylstyrene, 3-methylstyrene, 4-methylstyrene, 2-ethylstyrene, 3-ethylstyrene, 4-ethylstyrene, 2,4-diisopropylstyrene, 2,4-dimethylstyrene, 4-t-butylstyrene, 5-t-butyl-2-methylstyrene, 2-chlorostyrene, 3-chlorostyrene, 4-chlorostyrene, 4-bromostyrene, 2-methyl-4,6-dichlorostyrene, 2,4-dibromostyrene, and vinylnaphthalene. Among these, styrene is preferably used. These aromatic vinyl monomers may be used each singly or in combination of two or more kinds thereof, in each of the aromatic vinyl polymer blocks. Also, in each of the aromatic vinyl polymer blocks, same aromatic vinyl monomer may be used, and different aromatic vinyl monomer may respectively be used.

The aromatic vinyl polymer blocks ($Ar1^a$, $Ar2^a$, $Ar^b$, and $Ar^c$) in the block copolymers A to C may respectively include a monomer unit other than the aromatic vinyl monomer unit. Examples of the monomer that constitutes the monomer unit other than the aromatic vinyl monomer unit that can be included in the aromatic vinyl polymer blocks may include, conjugated diene monomers such as 1,3-butadiene and isoprene(2-methyl-1,3-butadiene), α,β-unsaturated nitrile monomer, unsaturated carboxylic acid or acid anhydride monomer, unsaturated carboxylic ester monomer, and nonconjugated diene monomer. The content of the monomer unit other than the aromatic vinyl monomer unit in each of the aromatic vinyl polymer block is preferably 20% by mass or less, more preferably 10% by mass or less, and particularly preferably substantially 0% by mass.

The conjugated diene polymer blocks ($D^a$, $D^b$, and $D^c$) in the block copolymers A to C are respectively a polymer block formed from a conjugated diene monomer unit. There are no particular limitations on the conjugated diene used to constitute the conjugated diene monomer unit of the conjugated diene polymer block if it is a conjugated diene compound, and examples thereof may include 1,3-butadiene, isoprene, 2,3-dimethyl-1,3-butadiene, 2-chloro-1,3-butadiene, 1,3-pentadiene, and 1,3-hexadiene. Among these, it is preferable to use 1,3-butadiene and/or isoprene, and it is particularly preferable to use isoprene. When the conjugated diene polymer block is formed from an isoprene unit, the block copolymer composition for a flexographic plate to be obtained may be highly flexible and may provide a flexographic plate excellent in flexibility. These conjugated diene monomers can be respectively used singly or in combination of two or more kinds thereof in each of the conjugated diene polymer blocks. Also, in each of the conjugated diene polymer blocks, same conjugated diene monomer may be used, and different conjugated diene monomer may respectively be used. Further, some of the unsaturated bonds in each of the conjugated diene polymer blocks may be subjected to a hydrogenation reaction.

The conjugated diene polymer blocks ($D^a$, $D^b$, and $D^c$) in the block copolymers A to C may respectively include a monomer unit other than the conjugated diene monomer unit. Examples of the monomer that constitutes the monomer unit other than the conjugated diene monomer unit that can be included in the conjugated diene polymer block may include, aromatic vinyl monomers such as styrene and α-methylstyrene, α,β-unsaturated nitrile monomers, unsaturated carboxylic acid or acid anhydride monomers, unsaturated carboxylic acid ester monomers, and non-conjugated diene monomers. The content of the monomer unit other than the conjugated diene monomer unit in each of the conjugated diene polymer blocks is preferably 20% by mass or less, more preferably 10% by mass or less, and particularly preferably substantially 0% by mass.

The block copolymer A that constitutes the block copolymer composition for a flexographic plate of the present invention is an asymmetric aromatic vinyl-conjugated diene-aromatic vinyl block copolymer represented in the above general formula (A), wherein the aromatic vinyl polymer block $Ar1^a$ having relatively small weight average molecular weight, the conjugated diene polymer block $D^a$ including the specified vinyl bond content, and the aromatic vinyl polymer block $Ar2^a$ having relatively large weight average molecular weight are linked in this order.

The weight average molecular weight ($Mw(Ar1^a)$) of the aromatic vinyl polymer block $Ar1^a$ having relatively small weight average molecular weight is 6,000 to 20,000, preferably 7,000 to 18,000, and more preferably 8,000 to 16,000. If the $Mw(Ar1^a)$ is out of this range, there is a risk that the rubber elasticity of the block copolymer composition for a flexographic plate to be obtained may be insufficient.

Also, the weight average molecular weight ($Mw(Ar2^a)$) of the aromatic vinyl polymer block $Ar2^a$ having relatively large weight average molecular weight is 25,000 to 400,000, preferably 25,000 to 300,000, and more preferably 25,000 to 200,000. If the $Mw(Ar2^a)$ is too small, there is a risk that the block copolymer composition for a flexographic plate to be obtained may be inferior in abrasion resistance and may easily express anisotropy. In addition, it may be difficult in some cases to produce the block copolymer A having too large $Mw(Ar2^a)$.

Incidentally, in the present invention, the weight average molecular weight of the polymer or polymer block will be determined as a value measured by high performance liquid chromatography and calculated relative to polystyrene standards.

In the block copolymer A, the ratio $Mw(Ar2^a)/Mw(Ar1^a)$ of the weight average molecular weight $Mw(Ar2^a)$ of the aromatic vinyl polymer block $Ar2^a$ having relatively large weight average molecular weight and the aromatic vinyl polymer block $Mw(Ar1^a)$ of the aromatic vinyl polymer block $Ar1^a$ having relatively small weight average molecular weight is 2 to 20, preferably 2 to 18, and more preferably 2 to 16. The block copolymer A is formed in this way, and thus the block copolymer composition for a flexographic plate to be obtained may maintain rubber elasticity even when the proportion of the aromatic vinyl monomer unit therein is increased to have excellent abrasion resistance.

The vinyl bond content of the conjugated diene polymer block $D^a$ of the block copolymer A (the content of 1,2-vinyl bonds and 3,4-vinyl bonds relative to all conjugated diene monomer units) is 21% to 70% by mole, preferably 21% to 65% by mole, and more preferably 21% to 60% by mole. The vinyl bond content in the above described range allows the crosslinking properties of the block copolymer composition for a flexographic plate to be excellent, and thus clear images may be formed in a flexographic plate while the durability of the image may be improved. Incidentally, it is considered that increasing the amount of light irradiation during curing a photosensitive composition for a flexographic plate including the block copolymer composition for a flexographic plate may also improve the level of crosslinking. However, influences such as halation increase along with the increase in the amount of light irradiation to deteriorate resolution; as a result, there is a risk that the printing images may be unclear.

The weight average molecular weight $Mw(D^a)$ of the conjugated diene polymer block $D^a$ of the block copolymer A is not particularly limited, but is usually 40,000 to 200,000, preferably 42,000 to 180,000, and more preferably 4,5000 to 150,000. The $Mw(D^a)$ is in the above described range, and thus the block copolymer composition for a flexographic plate to be obtained may maintain rubber elasticity even when the proportion of the aromatic vinyl monomer unit therein is increased to have excellent abrasion resistance.

The content of the aromatic vinyl monomer unit relative to all monomer units in the block copolymer A is not particularly limited, but is preferably 41% or more, more preferably 43% to 95% by mass, and particularly preferably 45% to 90% by mass. The reason therefor is that when the content of the aromatic vinyl monomer unit relative to all monomer units in the block copolymer A is in the above described range, the block copolymer composition for a flexographic plate to be obtained may be excellent in abrasion resistance and ink-swelling resistance.

The weight average molecular weight of the block copolymer A as a whole is not particularly limited, but is usually 70,000 to 500,000, preferably 80,000 to 450,000, and more preferably 90,000 to 400,000.

The block copolymer B that constitutes the block copolymer composition for a flexographic plate of the present invention is, as represented in the general formula (B), a block copolymer formed by two or more of the diblock $Ar^b$-$D^b$, which is formed by the aromatic vinyl polymer block $Ar^b$ having a specified weight average molecular weight bonded to the conjugated diene polymer block $D^b$ having a specified vinyl bond content, bonded directly in a single bond or bonded interposing the residue of coupling agent.

The weight average molecular weight $Mw(Ar^b)$ of the aromatic vinyl polymer block $Ar^b$ that constitutes the block copolymer B is 6,000 to 20,000, and is preferably 7,000 to 18,000, and more preferably 8,000 to 16,000. If the $Mw(Ar^b)$ is too small, there is a risk that the block copolymer composition for a flexographic plate to be obtained may have inferior abrasion resistance, and if the $Mw(Ar^b)$ is too large, there is a risk that the composition may have inferior flexibility or rubber elasticity. The weight average molecular weight $Mw(Ar^b)$ of the aromatic vinyl polymer block plurally included in the block copolymer B may be equal in each polymer block and may be different in each polymer block as long as in the above described range, but is preferably substantially equal in each polymer block. In addition, each of the weight average molecular weight $Mw(Ar^b)$ of these aromatic vinyl polymer blocks is more preferably substantially equal to the weight average molecular weight $Mw(Ar1^a)$ of the aromatic vinyl polymer block $Ar1^a$ having relatively small weight average molecular weight in the block copolymer A.

The vinyl bond content of the conjugated diene polymer block $D^b$ of the block copolymer B is 21% to 70% by mole, preferably 21% to 65% by mole, and more preferably 21% to 60% by mole. The vinyl bond content in the above described range allows the crosslinking properties of the block copolymer composition for a flexographic plate to be excellent, and thus clear images may be formed in a flexographic plate while the durability of the image may be improved. In addition, the vinyl bond content of the conjugated diene polymer block $D^b$ of the block copolymer B is preferably substantially equal to the vinyl bond content of the conjugated diene polymer block $D^a$ of the block copolymer A.

The block copolymer B is formed by the diblocks $Ar^b$-$D^b$, which is formed by the aromatic vinyl polymer block $Ar^b$ bonded to the conjugated diene polymer block $D^b$, bonded directly in a single bond or bonded interposing the residue of coupling agent.

The coupling agent that constitutes the residue of coupling agent is not particularly limited, and is an arbitrary coupling agent that is bifunctional or more. Examples of bifunctional coupling agent may include bifunctional halogenated silane such as dichlorosilane, monomethyldichlorosilane, and dimethyldichlorosilane; bifunctional alkoxysilane such as diphenyldimethoxysilane and diphenyldiethoxysilane; bifunctional halogenated alkane such as dichloroethane, dibromoethane, methylene chloride, and dibromomethane; bifunctional halogenated tin such as dichloro-tin, monomethyldichlorotin, dimethyldichlorotin, monoethyldichlorotin, diethyldichlorotin, monobutyldichlorotin, and dibutyldichlorotin; dibromobenzene, benzoic acid, carbon monoxide, and 2-chloropropene. Examples of trifunctional coupling agent may include trifunctional halogenated alkane such as trichloroethane and trichloropropane; trifunctional halogenated silane such as methyltrichlorosilane and ethyltrichlorosilane; and trifunctional alkoxysilane such as methyltrimethoxysilane, phenyltrimethoxysilane, and phenyltriethoxysilane. Examples of tetrafunctional coupling agent may include tetrafunctional halogenated alkane such as carbon tetrachloride, carbon tetrabromide, and tetrachloroethane; tetrafunctional halogenated silane such as tetrachlorosilane and tetrabromosilane; tetrafunctional alkoxysilane such as tetramethoxysilane and tetraethoxysilane; and tetrafunctional halogenated tin such as tetrachlorotin and tetrabromotin. Examples of pentafunctional or more coupling agent may include 1,1,1,2,2-pentachloroethane, perchloroethane, pentachlorobenzene, perchlorobenzene, octabromodiphenylether, and decabromodiphenylether. These coupling agents may be used singly in one kind, or two kinds or more thereof may be used in combination.

In addition, in order to obtain the block copolymer B, among these coupling agents, it is preferable to use a compound including two or more of at least one kind of the functional group selected from an alkoxyl group, an ester group, and an epoxy group in one molecular as a functional group that reacts with the active terminal of the polymer, and it is particularly preferable to use an alkoxy silane compound including two or more alkoxy groups directly bonded to a silicon atom per one molecule. That is, the block copolymer B that constitutes the block copolymer composition for a flexographic plate of the present invention is preferably obtained by using the compound including two or more of at least one kind of the functional group selected from an alkoxyl group, an ester group, and an epoxy group in one molecular as a coupling agent, and is particularly preferably obtained by using an alkoxy silane compound including two or more alkoxy groups directly bonded to a silicon atom per one molecule, as a coupling agent. Use of such a coupling agent allows the block copolymer composition for a flexographic plate to have excellent transparency, and it may be easy to obtain a flexographic plate in which fine printing patterns are formed from the obtained photosensitive composition for a flexographic plate.

In the block copolymer B, the number of the bond of the diblock $Ar^b$-$D^b$, that is n in the general formula (B), is not particularly limited if it is 2 or more; the block copolymers B having different number of the bond of the diblock may be mixed. The n in the general formula (B) is not particularly limited if it is an integer of 2 or more, but is usually an integer of 2 to 8, and preferably an integer of 2 to 4. Also, as at least as a part of the block copolymer B, it is particularly preferable that three or more of the diblock $Ar^b$-$D^b$ are bonded interposing the coupling agent (that is, n is 3 or more in the general formula (B)). The block copolymer composition for a flexographic plate of the present invention may provide a flexographic plate having high isotropy that has homogeneous mechanical characteristics over all directions even when a forming method that easily cause molecular orientation such as an extrusion molding method is used when the flexographic plate is produced. When three or more of the diblock $Ar^b$-$D^b$ bonded interposing the coupling agent is included as at least a part of the block copolymer B, a flexographic plate particularly high in isotropy and not easily causing printing defect may be obtained.

The weight average molecular weight $Mw(D^b)$ of the conjugated diene polymer block $D^b$ of the block copolymer B is not particularly limited, but is usually 40,000 to 200,000, and is preferably 42,000 to 180,000, and more preferably 45,000 to 150,000. The $Mw(D^b)$ is in the above described range, and thus the block copolymer composition for a flexographic plate to be obtained may maintain rubber elasticity even when the proportion of the aromatic vinyl monomer unit therein is increased to have excellent abrasion resistance. In addition, the weight average molecular weight $Mw(D^b)$ of the conjugated diene polymer block $D^b$ of the block copolymer B is preferably substantially equal to the weight average molecular weight $Mw(D^a)$ of the conjugated diene polymer block $D^a$ of the block copolymer A.

Incidentally, when an aromatic vinyl-conjugated diene-aromatic vinyl block copolymer produced without using a coupling agent is used as the block copolymer B, the conjugated diene polymer block included therein is formed by all the monomer units directly bonded, that is substantially not formed from two of the conjugated diene polymer block $D^b$. However, in the present invention, such a conjugated diene polymer block is also conceptionally treated as the polymer block wherein the two of the conjugated diene polymer block $D^b$ having a substantially equal weight average molecular weight are bonded in a single bond. Thus, for example, in the block copolymer B that is an aromatic vinyl-conjugated diene-aromatic vinyl block copolymer produced without using a coupling agent, when the conjugated diene polymer block has the weight average molecular weight of 100,000 as a whole, $Mw(D^b)$ thereof is treated as 50,000.

The content of the aromatic vinyl monomer unit relative to all monomer units in the block copolymer B is not particularly limited, but is usually 10% to 35% by mass, preferably 11% to 32% by mass, and more preferably 12% to 30% by mass.

The weight average molecular weight of the block copolymer B as a whole is also not particularly limited, but is usually 52,000 to 800,000, preferably 70,000 to 600,000, and more preferably 100,000 to 400,000.

The block copolymer C that can be included in the block copolymer composition for a flexographic plate of the present invention is, as represented by the above general formula (C), a block copolymer formed by the aromatic vinyl polymer block $Ar^c$ having a specified weight average molecular weight bonded to the conjugated diene polymer block $D^c$ having a specified vinyl bond content. When this block copolymer C is included, the block copolymer composition for a flexographic plate may have particularly well-balanced in abrasion resistance and rubber elasticity.

The weight average molecular weight $Mw(Ar^c)$ of the aromatic vinyl polymer block $Ar^c$ that constitutes the block copolymer C is 6,000 to 20,000, preferably 7,000 to 18,000, and more preferably 8,000 to 16,000. Furthermore, it is preferable that the weight average molecular weight $Mw(Ar^c)$ of the aromatic vinyl polymer block $Ar^c$ of the block copolymer C be substantially equal to at least one of the weight average molecular weight $Mw(Ar1^a)$ of the aromatic vinyl polymer block $Ar1^a$ having a relatively small weight average molecular weight of the block copolymer A and the weight average molecular weight $Mw(Ar^b)$ of the aromatic vinyl polymer block $Ar^b$ of the block copolymer B, and it is more preferable that the $Mw(Ar^c)$ be substantially equal to the both of Mw ($Ar1^a$) and $Mw(Ar^b)$.

The vinyl bond content of the conjugated diene polymer block $D^c$ of the block copolymer C is 21% to 70% by mole, preferably 21% to 65% by mole, and more preferably 21% to 60% by mole. The vinyl bond content in the above described range allows the crosslinking properties of the block copolymer composition for a flexographic plate to be excellent, and thus clear images may be formed in a flexographic plate while the durability of the image may be improved. In addition, it is preferable that the vinyl bond content of the conjugated diene polymer block $D^c$ of the block copolymer C be substantially equal to at least one of the vinyl bond content of the conjugated diene polymer block $D^a$ of the block copolymer A and the vinyl bond content of the conjugated diene polymer block $D^b$ of the block copolymer B, and it is more preferable that the vinyl bond content of $D^c$ be equal to both the vinyl bond content of $D^a$ and $D^b$.

The weight average molecular weight $Mw(D^c)$ of the conjugated diene polymer block $D^c$ of the block copolymer C is not particularly limited, but is usually 40,000 to 200,000, preferably 42,000 to 180,000, and more preferably 45,000 to 150,000. The $Mw(D^c)$ is in the above described range, and thus the block copolymer composition for a flexographic plate to be obtained may have excellent rubber elasticity. In addition, it is preferable that the weight average molecular weight $Mw(D^c)$ of the conjugated diene polymer block $D^c$ of the block copolymer C be substantially equal to at least one of the weight average molecular weight $Mw(D^a)$ of the conjugated diene polymer block $D^a$ of the block copolymer A and the weight average molecular weight $Mw(D^b)$ of the conjugated diene polymer block $D^b$ of the block copolymer B, and it is more preferable that the $Mw(D^c)$ be substantially equal to the both of $Mw(D^a)$ and $Mw(D^b)$.

The content of the aromatic vinyl monomer unit relative to all the monomer units in the block copolymer C is note particularly limited, but is usually 10% to 35% by mass, preferably 12% to 32% by mass, and more preferably 15% to 30% by mass. In addition, the content of the aromatic vinyl monomer unit relative to all the monomer units in the block copolymer C is preferably substantially equal to the content of the aromatic vinyl monomer unit relative to all the monomer units in the block copolymer B.

The weight average molecular weight of the block copolymer C as a whole is also not particularly limited, but is usually 46,000 to 200,000, preferably 50,000 to 180,000, and more preferably 55,000 to 160,000.

The molecular weight distribution that is expressed as the ratio Mw/Mn between the weight average molecular weight Mw and the number average molecular weight Mn of the various polymer blocks constituting each of the block copolymers A to C is not particularly limited, but the molecular weight distribution is, in each case, usually 1.1 or less, and preferably 1.05 or less.

The mass ratio A/B of the block copolymer A with respect to the block copolymer B included in the block copolymer composition for a flexographic plate of the present invention is not particularly limited, but is preferably 36/64 to 85/15, more preferably 38/62 to 80/20, and particularly preferably 40/60 to 75/25. The block copolymer A and the block copolymer B are included in such a ratio, and thus the block copolymer composition for a flexographic plate to be obtained may be excellent in abrasion resistance while maintaining sufficient rubber elasticity.

There are no particular limitations on the amount of the block copolymer C that can be included in the block copolymer composition for flexographic plate of the present invention. As a mass ratio C/(A+B), which is relative to the total mass of the block copolymer A and the block copolymer B, the amount of the block copolymer C is preferably 0/100 to 50/50, more preferably 5/95 to 40/60, and particularly preferably 10/90 to 30/70. The block copolymer C is included in such a ratio, and thus the block copolymer composition for a flexographic plate may be particularly well-balanced in abrasion resistance and rubber elasticity.

The block copolymer composition for a flexographic plate of the present invention may include just the block copolymers A to C as the polymer components, and may also include a polymer component other than the block copolymers A to C. Examples of the polymer component other than the block copolymers A to C that can be included in the block copolymer composition for a flexographic plate of the present invention may be an aromatic vinyl-conjugated diene-aromatic vinyl block copolymer other than the block copolymer A and the block copolymer B, an aromatic vinyl-conjugated diene block copolymer other than the block copolymer C, an aromatic vinyl homopolymer, a conjugated diene homopolymer, an aromatic vinyl-conjugated diene random copolymer, and branch-type polymers of these, or a thermoplastic elastomer such as a polyurethane-based thermoplastic elastomer, a polyamide-based thermoplastic elastomer, and a polyester-based thermoplastic elastomer, and a thermoplastic resin such as polyethylene, polypropylene, polyvinylchloride, an acrylonitrile-styrene copolymer, an acrylonitrile-butadiene-styrene copolymer, and polyphenylene ether. In the block copolymer composition for a flexographic plate of the present invention, the content of the polymer component other than the block copolymers A to C relative to all the polymer components is, preferably 20% by mass or less, and more preferably 10% by mass or less.

In the block copolymer composition for a flexographic plate of the present invention, the content of the aromatic vinyl monomer unit relative to all the monomer units that constitutes the polymer component (in the following descriptions, may be referred to as "overall content of aromatic vinyl monomer unit") is, 18% to 70% by mass, preferably 20% to 70% by mass, more preferably 22% to 60% by mass, and particularly preferably 25% to 50% by mass. If the overall content of aromatic vinyl monomer unit is too small, there is a risk that the block copolymer composition for a flexographic plate may be inferior in abrasion resistance and ink-selling resistance, and if the overall content of aromatic vinyl monomer unit is too large, there is a risk that the block copolymer composition for a flexographic plate may lose rubber elasticity required as a flexographic plate. The overall content of aromatic vinyl monomer unit can be easily adjusted by considering each content of the aromatic vinyl monomer unit of the block copolymers A to C and the polymer component other than those that constitute the block copolymer composition for a flexographic plate, and adjusting the blending amount of those. Incidentally, in a case all of the polymer components that constitute the block copolymer composition for a flexographic plate are composed only of aromatic vinyl monomer units and conjugated diene monomer units, when the polymer components of the block copolymer composition for a flexographic plate are subjected to ozone decomposition and then to reduction by lithium aluminum hydride according to the method described in Rubber Chem. Technol., 45, 1295 (1972), the conjugated diene monomer unit moieties are decomposed and only the aromatic vinyl monomer unit moieties can be extracted. Therefore, the overall content of aromatic vinyl monomer units can be measured easily.

The weight average molecular weight of the overall polymer components that constitute the block copolymer composition for a flexographic plate of the present invention is not particularly limited, but is usually 50,000 to 500,000, preferably 60,000 to 450,000, and more preferably 70,000 to 400,000. In addition, the molecular weight distribution represented by the ratio Mw/Mn of the weight average molecular weight (Mw) and the number average molecular weight (Mn) of the overall polymer components that constitute the block copolymer composition for a flexographic plate of the present invention is not particularly limited, but is usually 1.01 to 10, preferably 1.03 to 5, and more preferably 1.05 to 3.

The type A hardness of the block copolymer composition for a flexographic plate of the present invention is 25 to 65, preferably 26 to 65, and more preferably 27 to 65. The type A hardness is in the above described range, and thus the block copolymer composition for a flexographic plate may maintain rubber elasticity even when the proportion of the aromatic vinyl monomer unit therein is increased to have excellent abrasion resistance.

The type A hardness here is a value measured with a durometer hardness tester (type A) in accordance with JIS K6253.

In addition, the anisotropic index of the block copolymer composition for a flexographic plate of the present invention is 2.0 or less, preferably 1.8 or less, and more preferably 1.5 or less. The flexographic plate that does not easily express anisotropy but has high isotropy and does not easily cause printing defect may be obtained with the isotropic index in the above described range, even when a forming method that easily cause molecular orientation such as an extrusion molding method is used when the flexographic plate is produced.

The isotropic index here is a value obtained from the rate of "a tensile elastic modulus in the melt flow direction/a tensile elastic modulus in the vertical direction to melt flows" of two of a sheet produced by melting and extrusion molding the block copolymer composition for a flexographic plate, one of which tensile elastic modulus along with the melt flow direction during molding is measured, and the other of which the tensile elastic modulus along with the vertical direction to melt flows during molding is measured. When the rate of "a tensile elastic modulus in the melt flow direction/a tensile elastic modulus in the vertical direction to melt flows" is closer to 1, the anisotropy is smaller and isotropy is more excellent.

There are no particular limitations on the method for obtaining the block copolymer composition for a flexographic plate of the present invention. For example, the composition may be produced in a manner such that the block copolymer A and the block copolymer B may be respectively produced in accordance with a conventional production method of a block copolymer separately, and the block copolymer C and an additional polymer component may be blended therewith as required, and then mixed in accordance with a usual method such as kneading and solution mixing. However, from the aspect of obtaining the block copolymer composition having particularly desirable configuration with better productivity, a production method described later is suitable.

The above described block copolymer composition for a flexographic plate of the present invention is provided with abrasion resistance, which is highly superior to conventional polymer compositions for a flexographic plate, while maintaining sufficient rubber elasticity, excellent cross-linking properties, and small anisotropy. Accordingly, with the use of the block copolymer composition for a flexographic plate of the present invention, a flexographic plate having high definition printing properties, excellent ink-swelling resistance, and highly balanced abrasion resistance and flexibility may be obtained. There are no particular limitations on the way of obtaining a flexographic plate with the use of the block copolymer composition for a flexographic plate of the present invention, but a general way of obtaining a flexographic plate is by making the composition to be photosensitive and molding the photosensitive composition to be in a sheet shape, then exposing the sheet to light.

B. Method for Producing Block Copolymer Composition for Flexographic Plate

The block copolymer composition for a flexographic plate of the present invention is preferably produced using a production method including the following steps (1) to (5).

(1): A first step of forming an aromatic vinyl polymer including an active terminal by polymerizing an aromatic vinyl monomer using a polymerization initiator in a solvent;

(2): A second step of forming an aromatic vinyl-conjugated diene block copolymer including an active terminal by adding a conjugated diene monomer to a solution obtained in the first step for polymerization;

(3): A third step of forming a block copolymer B by adding a coupling agent to a solution obtained in the second step, the coupling agent in an amount the functional group relative to the active terminal is less than one equimolar amount;

(4): A fourth step of forming a block copolymer A by adding an aromatic vinyl monomer to a solution obtained in the third step for polymerization; and (5): A fifth step of collecting the block copolymer composition for the flexographic plate from a solution obtained in the fourth step.

According to the production method described above, since the block copolymer A and the block copolymer B can be continuously obtained in the same reaction vessel, an intended block copolymer composition for a flexographic plate can be obtained with extremely excellent productivity as compared with the case of individually producing the respective block copolymers and mixing them. On top of that, the composition to be obtained may have particularly desirable balance of the weight average molecular weight of each of the polymer blocks in each of the block copolymers as the block copolymer composition for a flexographic plate; thus, the block copolymer composition for a flexographic plate particularly excellent in balance of abrasion resistance and rubber elasticity can be obtained.

Above all, as described in the section "A. Block copolymer composition for flexographic plate" above, the coupling agent to be added in the third step is preferably a compound including two or more of at least one kind of functional group selected from an alkoxyl group, an ester group and an epoxy group in one molecule. In this case, it is preferable that the reactions in at least the second step, the third step, and the fourth step are conducted under the presence of a Lewis base compound, and the amount of the Lewis base compound is in a specified range. The production method like above is a suitable method for producing the above described block copolymer composition for a flexographic plate, wherein the block copolymer B in the block copolymer composition for a flexographic plate is obtained by using, as a coupling agent, a compound including two or more of at least one kind of functional group selected from an alkoxyl group, an ester group and an epoxy group in one molecule.

Each step of the method for producing the block copolymer composition of the present invention is hereinafter described.

1. First Step

In the first step, an aromatic vinyl polymer including an active terminal is formed by polymerizing an aromatic vinyl monomer using a polymerization initiator in a solvent.

As the polymerization initiator used in the first step, a compound generally known to have an anion polymerization activity to an aromatic vinyl monomer and a conjugated diene monomer, such as an organic alkali metal compound, an organic alkali earth metal compound, and an organic rare earth metal compound of lanthanoid series may be used. As the organic alkali metal compound, an organic lithium compound including one or more of a lithium atom in one molecule is particularly suitably used. Specific examples thereof may include an organic monolithium compound such as ethyllithium, n-propyllithium, isopropyllithium, n-butyllithium, sec-butyllithium, t-butyllithium, hexyllithium, phenyllithium, stilbenelithium, dialkylaminolithium, diphenylaminolithium, and ditrimethylsilylaminolithium; an organic dilithium compound such as methylenedilithium, tetramethylenedilithium, hexamethylenedilithium, isoprenyldilithium, and 1,4-dilithio-ethylcyclohexane; and an organic trilithium compound such as 1,3,5-trilithiobenzene. Among those, the organic monolithium compound is particularly suitably used.

Examples of the organic alkali earth metal compound used as the polymerization initiator may include n-butylmagnesiumbromide, n-hexylmagnesiumbromide, ethoxycalcium, calcium stearate, t-butoxystrontium, ethoxybarium, isopropoxybarium, ethylmercaptobarium, t-butoxybarium, phenoxybarium, diethylaminobarium, barium stearate, and ethylbarium. Furthermore, specific examples of other polymerization initiators include compounds that form a uniform system in organic solvent and have living polymerizability, such as composite catalysts formed from lanthanoid-based rare earth metal compounds including neodymium, samarium and gadolinium/alkylaluminum/ alkylaluminum halide/alkylaluminum hydride; and metallocene type catalysts including titanium, vanadium, samarium, and gadolinium. Incidentally, these polymerization initiators may be used singly, or two or more kinds thereof may be used in mixture.

The amount of use of the polymerization initiator may be determined in accordance with the molecular weights of the various intended block copolymers and are not particularly limited. However, the amount of use is usually 0.01 millimole to 20 millimoles, preferably 0.05 millimole to 15 millimoles, and more preferably 0.1 millimole to 10 millimoles, per 100 g of all the monomers used.

The solvent used for the polymerization is not particularly limited as long as it is inert to the polymerization initiator, and for example, chain-like hydrocarbon solvents, cyclic hydrocarbon solvents, or solvent mixtures thereof are used. Examples of the chain-like hydrocarbon solvents include chain-like alkanes and alkenes having 4 to 6 carbon atoms, such as n-butane, isobutane, 1-butene, isobutylene, trans-2-butene, cis-2-butene, 1-pentene, trans-2-pentene, cis-2-pentene, n-pentane, isopentane, neo-pentane, and n-hexane. Specific examples of the cyclic hydrocarbon solvents include aromatic compounds such as benzene, toluene, and xylene; and alicyclic hydrocarbon compounds such as cyclopentane and cyclohexane. These solvents may be used singly, or two or more kinds thereof may be used in mixture.

The amount of the solvent used for polymerization is not particularly limited, but the amount is set such that the total concentration of the block copolymers in the solution obtainable after the polymerization reaction would be usually 5% to 60% by mass, preferably 10% to 55% by mass, and more preferably 20% to 50% by mass.

On the occasion of obtaining the block copolymer composition for a flexographic plate, in order to control the structures of the various polymer blocks of the various block copolymers, a Lewis base compound may be added to the reactor used for the polymerization. Examples of this Lewis base compound include ethers such as tetrahydrofuran, diethyl ether, dioxane, ethylene glycol dimethyl ether, ethylene glycol dibutyl ether, diethylene glycol dimethyl ether, and diethylene glycol dibutyl ether; tertiary amines such as tetramethylethylenediamine, trimethylamine, triethylamine, pyridine, and quinuclidine; alkali metal alkoxides such as potassium t-amyl oxide and potassium t-butyl oxide; and phosphines such as triphenylphosphine. These Lewis base compounds are used singly or in combination of two or more kinds thereof, and are appropriately selected to the extent that the purposes of the present invention are not impaired.

Furthermore, the timing for adding the Lewis base compound at the time of the polymerization reaction is not particularly limited, and may be appropriately determined in accordance with the intended structures of the various block copolymers. For example, the Lewis base compound may be added in advance before polymerization is initiated, may be added after a portion of the polymer blocks have been polymerized, or may be added in advance before polymerization is initiated and then further added after a portion of the polymer blocks have been polymerized.

The polymerization reaction temperature is usually 10° C. to 150° C., preferably 30° C. to 130° C., and more preferably 40° C. to 90° C. The time required for polymerization may vary with the conditions, but the time for the polymerization reaction is usually 48 hours or less, and preferably 0.5 hour to 10 hours. The polymerization pressure is not particularly limited, and polymerization may be carried out in a pressure range sufficient for maintaining the monomers and the solvent in a liquid state in the polymerization temperature range mentioned above.

When an aromatic vinyl monomer is polymerized in a solvent using a polymerization initiator under the conditions such as described above, a solution containing an aromatic vinyl polymer including an active terminal can be obtained. This aromatic vinyl polymer including an active terminal constitutes the aromatic vinyl polymer block $(Ar1^a)$ having a relatively small weight average molecular weight of the block copolymer A, and the aromatic vinyl polymer block $(Ar^b)$ of the block copolymer B, those constitute the block copolymer composition. Therefore, the amount of the aromatic vinyl monomer used at this time is determined depending on the intended weight average molecular weights of these polymer blocks.

2. Second Step

In the second step, an aromatic vinyl-conjugated diene block copolymer including an active terminal is formed by adding a conjugated diene monomer to a solution obtained in the first step for polymerization.

Through the addition of a conjugated diene monomer, a conjugated diene polymer chain is formed from the active terminal, and thus a solution containing an aromatic vinyl-conjugated diene block copolymer(diblock) including an active terminal is obtained. The amount of the conjugated diene monomer used at this time is determined such that the resulting conjugated diene polymer chain would have the intended weight average molecular weight of the conjugated diene polymer block $(D^b)$ of the block copolymer B.

In the second step, it is preferable that the polymerization is conducted under the presence of a Lewis base compound. In this case, the amount of the Lewis base compound per 1 mole of the active terminal in the polymerization initiator is preferably 0.1 mole to 50 moles, more preferably 0.1 mole to 45 moles, and particularly preferably 0.1 mole to 40 moles. The polymerization of the conjugated diene monomer is conducted under the presence of the Lewis base compound, and thus the structure of the conjugated diene polymer block to be obtained may be controlled. On this occasion, the vinyl bond content in the conjugated diene polymer block to be obtained may be in a specified range, which is relatively high, when the amount of the Lewis base compound is in the above described range, which is relatively much. Thereby, crosslinking properties of the block copolymer composition for a flexographic plate may be improved, and thus a clear image can be formed in the flexographic plate while the durability of the image can be improved.

In addition, as described above, in the third step, when a compound including two or more of at least one kind of functional group selected from an alkoxyl group, an ester group and an epoxy group in one molecule is used as a coupling agent, it is preferable that the reactions in at least the second step, the third step, and the fourth step are conducted under the presence of the Lewis base compound. In this case, the timing of adding the Lewis base compound is not particularly limited as long as the reactions in the second step, the third step, and the fourth step can be conducted under the presence of the Lewis base compound. For example, the Lewis base compound may be added in the first step in advance before starting the polymerization, the Lewis base compound may be added in the second step after the first step, or the Lewis base compound may be added in the first step before starting the polymerization as well as further added in the second step. Also, the Lewis base compound may be further added in the third step, and the Lewis base compound may be further added in the fourth step.

In the case of adding the Lewis base compound further in the third step and the fourth step, the total amount of the Lewis base compound to be added in all the steps may be in the above described range. In this case, it is preferable that the amount of the Lewis base compound to be added until the second step is 0.1 mole or more per 1 mole of the active terminal in the polymerization initiator. As described above, the reason therefor is that the vinyl bond content in the conjugated diene polymer block to be obtained may be in a specified range, which is relatively high, when the amount of the Lewis base compound in the second step is in the above described range, which is relatively much.

3. Third Step

In the third step, a block copolymer B is formed by adding a coupling agent to a solution including the aromatic vinyl-conjugated diene block copolymer including the active terminal obtained in the second step, in an amount the functional group relative to the active terminal is less than one equimolar amount.

When a coupling agent is added to a solution including the aromatic vinyl-conjugated diene block copolymer (diblock) including the active terminal, in an amount the functional group relative to the active terminal is less than one equimolar amount, in partial copolymer among the aromatic vinyl-conjugated diene block copolymer (diblock) including the active terminal, conjugated diene polymer blocks are bonded to each other interposing the residue of the coupling agent; as a result, the block copolymer B of the block copolymer composition is formed. Then, a part of the rest of the aromatic vinyl-conjugated diene block copolymer (diblock) including the active terminal is left unreacted in the solution.

Examples of the coupling agent is as described in the section "A. Block copolymer composition for flexographic plate" above. In addition, the amount of the coupling agent to be added is not particularly limited as long as it is an amount determined in accordance with the ratio of the block copolymer A and the block copolymer B that constitute the block copolymer composition, and is an amount in which the functional group of the coupling agent relative to the active terminal of the polymer is less than one equimolar amount; however, the amount is usually such that the functional group of the coupling agent relative to the active terminal of the polymer is in the range of 0.10 equimolar to 0.90 equimolar, and preferably in the range of 0.15 equimolar to 0.70 equimolar. Incidentally, the conditions for the coupling reaction is not particularly limited, and is usually selected from the range of the aforementioned polymerization reaction conditions.

Furthermore, as described above, when a compound including two or more of at least one kind of functional group selected from an alkoxyl group, an ester group and an epoxy group in one molecule is used as the coupling agent, it is preferable that the reaction in the third step is conducted under the presence of the Lewis base compound.

Incidentally, with the above production method, there may be cases where a polymer component comprising an aromatic vinyl polymer block and a conjugated diene polymer block, that is different from all of the block copolymers A to C, is included in the block copolymer composition for a flexographic plate. For example, when an alkoxysilane compound including two or more of an alkoxy group directly bonded to a silicon atom in one molecule is used as the coupling agent, in this polymer component, the content of the aromatic vinyl monomer unit relative to all the monomer units is approximately in the middle level between that of the block copolymer A and that of the block copolymer B. In addition, the weight average molecular weight of the polymer component is approximately one time to three times of the weight average molecular weight of the block copolymer A. The structure of this polymer component is not always clear, but is presumed to be a block copolymer D represented by the below general formula (D) that can be generated from a mechanism such that the aromatic vinyl-conjugated diene block copolymer including an active terminal does not react with all the alkoxysilyl groups in the coupling agent and a part of the alkoxysilyl groups remains unreacted when a coupling block copolymer is formed, and then when the aromatic vinyl-conjugated diene-aromatic vinyl block copolymer including an active terminal is formed, that active terminal reacts with the unreacted alkoxysilyl group in the coupling agent.

$(Ar^b\text{-}D^b)_{n-1}\text{-}X\text{-}Ar2^a\text{-}D^a\text{-}Ar1^a$ (D)

In the general formula (D), $Ar2^a$, $Ar^b$, and $D^b$ represent the same as those in the general formula (A) and the general formula (B), X represents the residue of coupling agent, and n represents an integer of 2 or more.

When the polymer component presumed to be the block copolymer D as described above is included, the block copolymer composition for a flexographic plate may, in particular, have excellent balance of abrasion resistance and rubber elasticity and excellent isotropy that does not easily express anisotropy even when a forming method that easily cause molecular orientation such as an extrusion molding method is used. Therefore, when the block copolymer composition for a flexographic plate of the present invention is produced by the above described production method, it is particularly preferable that an alkoxysilane compound including two or more of an alkoxy group directly bonded to a silicon atom per one molecule is used as the coupling agent.

4. Fourth Step

In the fourth step, a block copolymer A is formed by adding an aromatic vinyl monomer to a solution obtained in the third step for polymerization.

When an aromatic vinyl monomer is added to the solution obtained in the third step, an aromatic vinyl polymer chain is formed from the terminal of the aromatic vinyl-conjugated diene block copolymer (diblock) including an active terminal that remained unreacted with the coupling agent. This aromatic vinyl polymer chain constitutes the aromatic vinyl polymer block (Ar2$^a$) having a relatively large weight average molecular weight of the block copolymer A that constitutes the block copolymer composition for a flexographic plate. Therefore, the amount of the aromatic vinyl monomer used at this time is determined in accordance with the intended weight average molecular weight of the aromatic vinyl polymer block (Ar2$^a$). Through this process for adding an aromatic vinyl monomer, an asymmetric aromatic vinyl-conjugated diene-aromatic vinyl block copolymer that constitutes the block copolymer A is formed, and as a result, a solution containing the block copolymer A and the block copolymer B is obtained. Incidentally, a conjugated diene monomer may be added to the solution containing an aromatic vinyl-conjugated diene block copolymer (diblock) including an active terminal that did not react with the coupling agent, before this step of adding an aromatic vinyl monomer. As such, when a conjugated diene monomer is added, the weight average molecular weight of the conjugated diene polymer block (D$^a$) of the block copolymer A can be made larger compared to the case of not adding the conjugated diene monomer.

As described above, when a compound including two or more of at least one kind of functional group selected from an alkoxyl group, an ester group and an epoxy group in one molecule is used as the coupling agent in the third step, it is preferable that the polymerization in the fourth step is conducted under the presence of the Lewis base compound, and the amount of the Lewis base compound is in a specified range. When a compound including two or more of at least one kind of functional group selected from an alkoxyl group, an ester group, and an epoxy group in one molecule is used as the coupling agent in the third step, there may be cases where a polymer component comprising an aromatic vinyl polymer block and a conjugated diene polymer block, that is different from all of the block copolymers A to C, is formed. Particularly when an alkoxysilane compound including two or more of an alkoxy group directly bonded to a silicon atom in one molecule is used as the coupling agent in the third step, as described above, there may be cases where a polymer component presumed to be the block copolymer D different from all of the block copolymers A to C is formed. In this case, such a side reaction may be inhibited by conducting the polymerization of the aromatic vinyl monomer under the presence of the Lewis base compound. On this occasion, the side reaction can be effectively inhibited by setting the amount of the Lewis base compound to be in a specified range, that is relatively much. Accordingly, the structure of the block copolymer to be obtained can be controlled while the side reaction can be effectively inhibited, and thus the block copolymer having a specified structure can be stably produced.

5. Fifth Step

In the fifth step, the block copolymer composition for the flexographic plate is collected from a solution obtained in the fourth step.

The method for collection may be carried out according to a conventional method, and there are no particular limitations. For example, the polymer components can be collected by adding, if necessary, a polymerization terminator such as water, methanol, ethanol, propanol, hydrochloric acid or citric acid after completion of the reaction, further adding additives such as an antioxidant as necessary, and applying a known method such as a direct drying method or steam stripping to the solution. When the block copolymer composition is collected as slurry by a method such as applying steam stripping, the block copolymer composition are dehydrated using an arbitrary dehydrator such as an extruder type squeezer to obtain a crumb having a water content of a predetermined value or less, and the crumb may be dried using an arbitrary dryer such as a band dryer or an expansion extrusion dryer. The block copolymer composition for a flexographic plate obtained as described above may be processed into a shape such as pellets according to a conventional method, and then may be supplied to the use.

6. Sixth Step

In the present invention, a sixth step of forming a block copolymer C by adding a polymerization terminator to the solution including an aromatic vinyl-conjugated diene block copolymer including an active terminal that did not react with the coupling agent obtained in the third step, in an amount less than equal amount of the active terminal, may be conducted after the third step and before the fourth step.

Addition of the polymerization terminator in this manner would deactivate the active terminal of the aromatic vinyl-conjugated diene block copolymer (diblock), and thus the aromatic vinyl-conjugated diene block copolymer (diblock) to be obtained thereby may be included in the block copolymer composition for a flexographic plate as the block copolymer C.

As the polymerization terminator, for example, a substance such as water, methanol, ethanol, propanol, hydrochloric acid, and citric acid may be used.

Incidentally, when the sixth step is arranged, the total amount of the functional group in the coupling agent and the polymerization terminator relative to the active terminal of the aromatic vinyl-conjugated diene block copolymer to be added needs to be an amount less than one equimolar amount.

C. Photosensitive Composition for Flexographic Plate

The photosensitive composition for a flexographic plate of the present invention comprises the above described block copolymer composition for a flexographic plate, an ethyleny unsaturated compound having a molecular weight of 5,000 or less, and a photopolymerization initiator.

The blending amount of the block copolymer composition for a flexographic plate relative to the total amount of the block copolymer composition for a flexographic plate and the ethyleny unsaturated compound is preferably 40% by mass to 95% by mass, and more preferably 50% by mass to 95% by mass.

Examples of the ethyleny unsaturated compound having a molecular weight of 5,000 or less may include diacrylate or dimethacrylate of divalent alcohol such as ethyleneglycol, diethyleneglycol, propyleneglycol, dipropyleneglycol, polyethyleneglycol, polypropyleneglycol, 1,4-butandiol, and 1,6-hexandiol; triacrylate or trimethacrylate of trimethylolpropane; tetraacrylate or tetramethacrylate of pentaerythritol; N,N'-(hexamethylene)bis(acrylamide), N,N'-(hexamethylene)bis(methacrylamide), diacetone acrylamide, diacetone methacrylamide, styrene, vinyltoluene, divinylbenzene, diallyl phthalate, and triallyl cyanurate. These may be used singly, or two or more kinds thereof may be used in combination.

The blending amount of the ethyleny unsaturated compound relative to the total amount of the block copolymer composition for a flexographic plate and the ethyleny unsaturated compound is preferably 5% by mass to 60% by mass, and more preferably 5% by mass to 50% by mass.

The total amount of the block copolymer composition for a flexographic plate and the ethyleny unsaturated compound relative to overall amount of the photosensitive compound for a flexographic plate is preferably 50% by mass or more, more preferably 60% by mass or more, and particularly preferably 70% by mass or more.

Examples of the photopolymerization initiator may include methylhydroquinone, benzophenone, benzoin, benzoin methyl ether, benzoin ethyl ether, benzoin isopropyl ether, benzoin isobutyl ether, α-methyl benzoin, α-methylbenzoin methyl ether, α-methoxybenzoin methyl ether, benzoin phenyl ether, α-t-butylbenzoin, anthraquinone, benzanthraquinone, 2-ethylanthraquinone, 2-chloranthraquinone, 2-2'-dimethoxy diphenyl acetophenone, 2,2-diethoxyphenylacetophenone, 2,2-diethoxyacetophenone, and pivaloin. These may be used singly, or two or more kinds thereof may be used in combination. The blending amount of the photopolymerization initiator relative to the total amount of the block copolymer composition for a flexographic plate and the ethyleny unsaturated compound is preferably 0.1% by mass to 5% by mass.

In the present invention, a component other than the above may also be added to the photosensitive composition for a flexographic plate as required. Examples of such a component may include a plasticizer, a thermopolymerization inhibitor, an antioxidant, an antiozonant, a dye, a pigment, a filler, an additive that exhibits photochromism, a reductant, an agent that improves relief structure, a cross-linking agent, a flow improver, and a mold releasing agent.

The plasticizer is usually used for purposes such as to easily produce and form the photosensitive composition for a flexographic plate, to promote the removal of nonexposed portion, and to adjust the hardness of cured exposed portion. Examples of the plasticizer may include a hydrocarbon oil such as a naphthenic oil and a paraffin oil; liquid 1,2-polybutadiene, liquid 1,4-polybutadiene, and the hydroxide or carboxylate of these; a liquid acrylonitrile-butadiene copolymer and the carboxylate thereof; a liquid styrene-butadiene copolymer and the carboxylate thereof; polystyrene having low molecular weight which is the molecular weight of 3,000 or less, an α-methylstyrene-vinyltoluene copolymer, a petroleum resin, a polyacrylate resin, a polyester resin, and a polyterpene resin. These may be used singly, or two or more kinds thereof may be used in combination. The plasticizer is usually added to the photosensitive composition for a flexographic plate in the range of 2% by mass to 50% by mass in accordance with the intended characteristics.

The thermopolymerization inhibitor is used for the purpose of inhibiting unintended thermopolymerization of the ethyleny unsaturated compound when the photosensitive composition for a flexographic plate is produced. Examples of the thermopolymerization inhibitor may include phenols such as hydroquinone, p-methoxyphenol, p-t-butylcatechol, 2,6-di-t-butyl-p-cresol, and pyrogallol; quinones such as benzoquinone, p-toluquinone, and p-xyloquinone; and amines such as phenyl-a-naphthylamine. These may be used singly, or two or more kinds thereof may be used in combination. The amount of use of the photopolymerization inhibitor is usually 0.001% by mass to 2% by mass in the photosensitive composition for a flexographic plate.

There are no particular limitations on the method for producing the photosensitive composition for a flexographic plate of the present invention. For example, the composition may be produced by kneading the constituent components of the composition with means such as a kneader, a roll mill, Banbury, and a uniaxial or multiaxial extruder. The obtained composition is usually molded into a sheet shape having a desired thickness, using a molding machine such as a uniaxial or multiaxial extruder, a compression molding machine, and a calendar molding machine. Incidentally, when the uniaxial or multiaxial extruder is used, the production of the photosensitive composition for a flexographic plate and molding into a sheet shape can be simultaneously conducted. Further, the photosensitive composition for a flexographic plate in a sheet shape can also be produced in a manner such that the constituent components of the photosensitive composition for a flexographic plate are dissolved in an appropriate solvent such as chloroform, carbon tetrachloride, trichloroethane, diethyl ketone, methyl ethyl ketone, benzene, toluene, and tetrahydrofuran, and then this solution is poured to a frame to vaporize the solvent.

The thickness of the sheet is usually 0.1 mm to 20 mm, and preferably 1 mm to 10 mm.

To the photosensitive composition for a flexographic plate in the sheet shape, a transparent sheet or a film formed of a resin such as polypropylene, polyethylene, and polyethylene terephthalate may be arranged on its surface as a base sheet layer or a protective film layer in order to prevent the contamination and damage of the photosensitive composition for a flexographic plate during its storage or operation.

A thin covering material layer with high flexibility may be arranged on the surface of the photosensitive composition for a flexographic plate in the sheet shape in order to restrain the adhesiveness of the surface of the composition and to enable the reuse of negative film after light irradiation. In this case, after the completion of the light exposure of the photosensitive composition for a flexographic plate, the covering material layer should be removed at the time of removing the unexposed portion with the solvent together. As the covering material layer, typically, a material such as a soluble polyamide and a cellulose derivative are frequently used.

D. Flexographic Plate

The flexographic plate of the present invention is obtained by exposing the photosensitive composition for a flexographic plate of the present invention to light.

The production of the flexographic plate is usually conducted in accordance with the following steps:

(i): Light is irradiated from the base sheet side of the multilayered sheet formed from a protective film, the layer of photosensitive composition for a flexographic plate in the sheet shape, and the base sheet, so as to cure the layer of photosensitive composition for a flexographic plate until a specified thickness;

(ii): The protective film is peeled off, a negative film is adhered, and light having a wavelength of 230 nm to 450 nm or preferably 350 nm to 450 nm is irradiated from above the negative film, and thereby the layer of the photosensitive composition for a flexographic plate is exposed to light. With this exposure, a portion of the layer of the photosensitive composition for a flexographic plate where the light transmitted is cured;

(iii): The portion of the layer of the photosensitive composition for a flexographic plate not exposed to light uncured is removed (development);

(iv): The uncured portion is removed in (iii) typically using a solvent, so the solvent remaining in the flexographic plate is dried;

(v): As desired, postexposure is conducted.

In the development (removal of the unexposed portion) step of (iii), a solvent is typically used. Examples of the solvent may include an aliphatic hydrocarbon or aromatic hydrocarbon such as n-hexane, n-heptane, octane, petroleum ether, naphtha, limonene, terpene, toluene, xylene, ethylbenzene, and isopropyl benzene; ketones such as acetone and methyl ethyl ketone; ethers such as di-n-butylether, and di-t-butylether; esters such as methyl acetate and ethyl acetate; and halogenated hydrocarbon such as methylene chloride, chloroform, trichloroethane, tetrachloroethylene, dichlorotetrafluoroethane, and trichlorotrifluoroethane. These may be used singly, or two kinds or more thereof may be used in combination. Further, to the solvent, a desired amount of alcohol such as methanol, ethanol, isopropanol, and n-butanol may be added and used. Incidentally, the development may be expedited by adding a mechanical force using means such as a brush under the presence of the solvent.

The flexographic plate of the present invention has sufficient flexibility, highly excellent abrasion resistance, and excellent ink-swelling resistance. Accordingly, the use of the flexographic plate of the present invention enables repeating print in multiple of times even under strict conditions, with excellent ink transfer during printing, and flexographic printing with excellent image quality. Incidentally, examples of the subject for the application of flexographic printing are various materials such as paper, cardboard, wood, metal, a polyethylene film, a polyethylene sheet, a polypropylene film, and polypropylene sheet.

The present invention is not limited to the embodiments. The embodiments are exemplifications, and any other variations are intended to be included in the technical scope of the present invention if they have substantially the same constitution as the technical idea described in the claim of the present invention and offer similar operation and effect thereto.

EXAMPLES

Hereinafter, the present invention will be more specifically described by way of Examples and Comparative Examples. Incidentally, unless particularly stated otherwise, parts and percentage (%) in the various Examples are on a mass basis.

Various measurements were carried out by the following methods.

[Weight Average Molecular Weight of Block Copolymer and Block Copolymer Composition]

The weight average molecular weight was determined as a molecular weight calculated relative to polystyrene standards, by high performance liquid chromatography using tetrahydrofuran as a carrier at a flow rate of 0.35 ml/min. The measurement was carried out using an HLC™-8220 manufactured by Tosoh Corp. as an apparatus, with three connected columns of SHODEX™ KF-404HQ manufactured by Showa Denko K.K. (column temperature 40° C.), and a differential refractometer and an ultraviolet detector as detectors, and using twelve samples of polystyrene standards (from 500 to 3,000,000) manufactured by Polymer Laboratories, Ltd. for the calibration of the molecular weight.

[Mass Ratio of Various Block Copolymers]

The mass ratio was determined from the area ratio of peaks corresponding to the various block copolymers in the charts obtained by high performance liquid chromatography as described above.

[Weight Average Molecular Weight of Styrene Polymer Block]

A block copolymer was caused to react with ozone according to the method described in Rubber Chem. Technol., 45, 1295 (1972), and was reduced using lithium aluminum hydride, and thereby an isoprene polymer block of the block copolymer was decomposed. Specifically, the process was carried out by the following procedure. That is, 300 mg of a sample was dissolved in a reaction vessel containing 100 ml of dichloromethane that had been treated with a molecular sieve. This reaction vessel was placed in a cooling tank, the temperature was set to −25° C., and then ozone generated by an ozone generator was introduced into the reaction vessel while oxygen was allowed to flow thereinto at a flow rate of 170 ml/min. After 30 minutes from the initiation of the reaction, it was checked whether the reaction had ended by introducing the gas discharged out from the reaction vessel into an aqueous solution of potassium iodide. Subsequently, 50 ml of diethyl ether and 470 mg of lithium aluminum hydride were introduced into another reaction vessel that had been purged with nitrogen, and while the reaction vessel was cooled with ice water, the solution that had reacted with ozone was slowly added dropwise to this reaction vessel. Then, the reaction vessel was placed in a water bath to raise the temperature slowly, and the reaction solution was refluxed at 40° C. for 30 minutes. Thereafter, dilute hydrochloric acid was added dropwise in small amounts while the solution was stirred, and dropwise addition was continued until generation of hydrogen was almost not recognized. After this reaction, the solid product generated in the solution was separated by filtration, and the solid product was extracted with 100 ml of diethyl ether for 10 minutes. This extract was combined with the filtrate obtained at the time of separation by filtration, and the solvent was distilled off. Thus, a solid sample was obtained. For the sample obtained as such, the weight average molecular weight was measured according to the method for measuring the weight average molecular weight described above, and the value was designated as the weight average molecular weight of the styrene polymer block.

[Weight Average Molecular Weight of Conjugated Diene Polymer Block]

The weight average molecular weight of the corresponding styrene polymer block was subtracted from the weight average molecular weight of each block copolymer determined as described above, and the weight average molecular weight of the conjugated diene polymer block (isoprene polymer block or butadiene polymer block) was determined based on the calculation value.

[Styrene Unit Content of Block Copolymer]

The styrene unit content was determined based on the ratio between the detection intensities of a differential refractometer and an ultraviolet detector in the analysis by high performance liquid chromatography described above. Incidentally, copolymers having different styrene unit contents were prepared, and a calibration curve was produced using those.

[Styrene Unit Content of Block Copolymer Composition]

The content was determined based on a proton NMR analysis.

[Vinyl Bond Content of Conjugated Diene Polymer Block]

The content was determined based on a proton NMR analysis.

[Type A Hardness of Block Copolymer Composition]

The type A hardness was measured with a durometer hardness tester (type A) in accordance with JIS K6253.

[Anisotropic Index of Block Copolymer Composition]

The block copolymer composition for a flexographic plate was heated at 150° C. and melted, and continuously extruded using a biaxial extruder with T-dye installed, so as to be molded into a sheet having a thickness of 2 mm. The detailed conditions for molding the sheet were as follows:

Composition treatment speed: 25 kg/hr;
Unloading speed: 1.0 m/min;
Extruder temperature: Input port 140° C., T-dye adjusted to 160° C.;
Screw: Full-flight;
Extruder L/D: 20; and
T-dye: Width 200 mm, lip 2.5 mm.

Two pieces of the obtained sheet were used, and the tensile elastic modulus of the one was measured along with the melt flow direction during molding, and the tensile elastic modulus of the other was measured along with the vertical direction to the melt flow during molding. The measurement procedures were as follows. The sheet was expanded to 100% with the tension rate of 300 mm/min using TENSILON universal testing instrument RTC-1210 from ORIENTEC Co., LTD., and the tension stress at the expansion of 100% during the process was measured, and the tensile elastic modulus of the sheet at the expansion of 100% was obtained. When the rate of "a tensile elastic modulus in the melt flow direction/a tensile elastic modulus in the vertical direction to melt flows" is closer to 1, the anisotropy is smaller and isotropy is more excellent.

[Tensile Elastic Modulus of Photosensitive Composition for Flexographic Plate]

The photosensitive composition for a flexographic plate was heated at 150° C. and melted, and continuously extruded using a biaxial extruder with T-dye installed, so as to be molded into a sheet having a thickness of 2 mm. The detailed conditions for molding the sheet were as follows:

Composition treatment speed: 25 kg/hr;
Unloading speed: 1.0 m/min;
Extruder temperature: Input port 140° C., T-dye adjusted to 160° C.;
Screw: Full-flight;
Extruder L/D: 20; and
T-dye: Width 200 mm, lip 2.5 mm.

The obtained sheet was exposed to light by irradiating active light for 10 minutes using an exposure machine (Type JE-A3-SS from Nihon Denshi Seiki Co., Ltd.) with an ultraviolet fluorescent lamp of 20 W installed, and dried for 30 minutes with a warm air dryer at 60° C. Two pieces of this exposed sheet were used, and the tensile elastic modulus of the one was measured along with the melt flow direction during molding, and the tensile elastic modulus of the other was measured along with the vertical direction to the melt flows during molding. The measurement procedures were as follows. The sheet was expanded to 100% with the tension rate of 300 mm/min using TENSILON universal testing instrument RTC-1210 from ORIENTEC Co., LTD., and the tension stress at the expansion of 100% during the process was measured, and the tensile elastic modulus of the sheet at the expansion of 100% was obtained. When the rate of "a tensile elastic modulus in the melt flow direction/a tensile elastic modulus in the vertical direction to melt flows" is closer to 1, the anisotropy is smaller and isotropy is more excellent.

[Tension Set of Photosensitive Composition for Flexographic Plate]

With the same method as that for the measurement of the tensile elastic modulus, the photosensitive composition for a flexographic plate was exposed to light and a sheet thereof was obtained. The tension set of this sheet was measured using the TENSILON universal testing instrument in accordance with ASTM 412. In specific, a sample shape used was Die A, and the sheet was expanded to the expanding rate of 200% with the inter-marker distance before expansion being 40 mm, the expanded state was kept for 10 minutes, and then rapidly contracted without rebounding, leave as it was for 10 minutes, and thereafter the inter-marker distance was measured and thereby the tension set was obtained from the below formula. When the value of the tension set is lower, the rubber elasticity is more excellent.

$$\text{Tension set (\%)} = (L1-L0)/L0*100$$

L0: inter-marker distance before expansion (mm)
L1: inter-marker distance after contracting and leaving for 10 minutes (mm)

Incidentally, in this measurement, two pieces of the sheet were used, and the value of the one along with the melt flow direction during molding was measured, and the value of the other along with the vertical direction to the melt flows during molding was measured, and each of the value was recorded.

[Abrasion Resistance of Photosensitive Composition for Flexographic Plate]

With the same method as that for the measurement of the tensile elastic modulus, the photosensitive composition for a flexographic plate was exposed to light and a sheet thereof was obtained. Next, the obtained sheet and a water-resistant paper No. 1000 were rubbed with a reciprocating motion and conditions of the load of 100 g and the speed of 6000 mm/sec using HEiDON abrasion tester (from Shinto Scientific Co., Ltd.), and the abrasion amount of the surface of both sheets after 1000 cycles were measured. Incidentally, this parameter is indicated as an index when Comparative Example 1 is regarded as 100. When the index is larger, the abrasion resistance is more excellent.

[Ink-Swelling Resistance of Photosensitive Composition for Flexographic Plate]

With the same method as that for the measurement of the tensile elastic modulus, the photosensitive composition for a flexographic plate was exposed to light and a sheet thereof was obtained. Next, a sheet of which weight was measured in advance was put into isopropyl alcohol. After 60 minutes, the sheet was taken out, and excess isopropyl alcohol was wiped out to measure the weight of the sheet. With the weight rate "the weight of sheet after test/the weight of sheet before test", the ink-swelling resistance was measured. In this parameter, when the rate is closer to 100%, the ink-swelling resistance is more excellent.

[Printing Properties (Gel Content)]

The gel content is a scale to see the level of cross-linking after the photosensitive composition for a flexographic plate is cured.

First, with the same method as that for the measurement of the tensile elastic modulus, the photosensitive composition for a flexographic plate was exposed to light and a sheet thereof was obtained. Next, a sheet of which weight was measured in advance was soaked in toluene overnight, and then taken out. Next, the sheet taken out from toluene was dried at 70° C. under reduced pressure until the weight loss could not be seen any more. Then, the weight of the sheet after drying was measured. The gel content was obtained from the following equation:

$$\text{Gel content (\%)} = (w1/w0)*100.$$

In the equation, w0 is the weight of the sheet before soaking in toluene, and w1 is the weight of the sheet after soaking in toluene and drying.

Production Example 1

In a pressure-resistant reactor, 23.3 kg of cyclohexane, 66.1 millimoles of N,N,N',N'-tetramethylethylenediamine (hereinafter, referred to as TMEDA), and 1.19 kg of styrene were introduced, and while the content was stirred at 40° C., 143.6 millimoles of n-butyllithium was added thereto. Polymerization was carried out for one hour while the temperature was increased to 50° C. The polymerization conversion ratio of styrene was 100%. Subsequently, 7.00 kg of isoprene was continuously added to the reactor over one hour while the temperature was controlled to be maintained at 50° C. to 60° C. After the addition of isoprene was completed, polymerization was carried out for another one hour. The polymerization conversion ratio of isoprene was 100%. Next, 31.1 millimoles of tetramethoxysilane was added thereto as a coupling agent, the coupling reaction was carried out for two hours, and thus, a styrene-isoprene block copolymer that served as a block copolymer B, was formed. Next, 28.7 millimoles of methanol was added to the reactor, and a portion of the active terminals of the styrene-isoprene block copolymer was deactivated. Thus, a styrene-isoprene block copolymer that served as a block copolymer C, was formed. Thereafter, 1.81 kg of styrene was continuously added thereto over one hour while the temperature was controlled to be maintained at 50° C. to 60° C. After the addition of styrene was completed, polymerization was carried out for another one hour, and thus a styrene-isoprene-styrene block copolymer that served as a block copolymer A was formed. The polymerization conversion ratio of styrene was 100%. Thereafter, 287.2 millimoles of methanol as a polymerization terminator was added thereto and mixed thoroughly therein, and thus the reaction was terminated. Incidentally, the amounts of the various reagents used in the reaction are summarized in Table 1.

A portion of the reaction liquid thus obtained was taken, and the weight average molecular weights of the various block copolymers and the weight average molecular weight of the block copolymer composition, the weight average molecular weights of the various styrene polymer blocks, the weight average molecular weights of the various isoprene polymer blocks, the styrene unit contents of the various block copolymers, the styrene unit content of the block copolymer composition, the vinyl bond content of the isoprene polymer block, and the mass ratios of the various block copolymers were determined. These values are presented in Table 2.

To 100 parts of the reaction liquid obtained as described above (including 30 parts of polymer components), 0.3 part of 2,6-di-t-butyl-p-cresol was added and mixed as an antioxidant, and the mixed solution was added dropwise in small amounts to hot water that had been heated to 85° C. to 95° C. to thereby volatilize the solvent, and thus a separating material was obtained. This separating material was pulverized and dried in hot air at 85° C., and thus a block copolymer composition of Production Example 1 was collected. The type A hardness and the anisotropic index of the block copolymer composition of Production Example 1 were measured. These values are presented in Table 2.

TABLE 1

| | Prodution Examples | | | | | | |
|---|---|---|---|---|---|---|---|
| | 1 | 2 | 3 | 4 | 5 | 6 | 7 |
| cyclohexane (kg) | 23.3 | 23.3 | 23.3 | 23.3 | 23.3 | 23.3 | 23.3 |
| TMEDA (millimoles) | 66.1 | 120.0 | 71.2 | 82.7 | 2.5 | 2.2 | 1.9 |
| n-butyllithium (millimoles) | 143.6 | 166.7 | 154.8 | 159.1 | 164.7 | 147.7 | 129.3 |
| Styrene (kg) [Polymerization first stage] | 1.19 | 1.33 | 1.30 | 1.32 | 1.55 | 1.49 | 1.16 |
| n-butyllithium (millimoles) [Polymerization first stage • Re-addition] | — | — | — | — | — | — | — |
| styrene (kg) [Polymerization first stage • Re-addition] | — | — | — | — | — | — | — |
| isoprene (kg) [Polymerization second stage] | 7.00 | 7.00 | 5.20 | 6.00 | 5.20 | 5.60 | 5.30 |
| butadiene (kg) [Polymerization second stage] | — | — | — | — | — | — | — |
| dimethylmethoxysilane (millimoles) [After polymerization second stage] | — | — | — | — | 60.1 | — | — |
| tetramethoxysilane (millimoles) [After polymerization second stage] | 31.1 | 36.1 | 37.7 | 34.5 | — | 28.7 | 16.2 |
| methanol (millimoles) [After polymerization second stage] | 28.7 | 25.0 | 23.2 | 23.9 | 23.1 | 31.0 | 18.1 |
| styrene (kg) [Polymerization third stage] | 1.81 | 1.67 | 3.50 | 2.68 | 3.25 | 2.91 | 3.54 |
| methanol (millimoles) [After polymerization third stage] | 287.2 | 333.4 | 309.6 | 318.2 | 329.4 | 295.4 | 258.6 |

| | Production Examples | | | | | | |
|---|---|---|---|---|---|---|---|
| | 8 | 9 | 10 | 11 | 12 | 13 | 14 |
| cyclohexane (kg) | 23.3 | 23.3 | 23.3 | 23.3 | 23.3 | 23.3 | 23.3 |
| TMEDA (millimoles) | 0.8 | 2.6 | 1.3 | 1.9 | 2.3 | 1.2 | 1.82 |
| n-butyllithium (millimoles) | 14.1 | 172.4 | 90.0 | 128.8 | 156.0 | 77.9 | 121.5 |
| Styrene (kg) [Polymerization first stage] | 1.24 | 1.90 | 0.90 | 1.50 | 2.20 | 4.15 | 1.25 |
| n-butyllithium (millimoles) [Polymerization first stage • Re-addition] | 43.2 | — | — | — | — | — | — |
| styrene (kg) [Polymerization first stage • Re-addition] | 0.85 | — | — | — | — | — | — |
| isoprene (kg) [Polymerization second stage] | 7.05 | 8.10 | 8.20 | 7.00 | 5.60 | 5.20 | — |

TABLE 1-continued

| | | | | | | | |
|---|---|---|---|---|---|---|---|
| butadiene (kg) | — | — | — | — | — | — | 7.50 |
| [Polymerization second stage] | | | | | | | |
| dimethylmethoxysilane (millimoles) | — | — | — | — | — | — | — |
| [After polymerization second stage] | | | | | | | |
| tetramethoxysilane (millimoles) | — | 34.5 | — | — | — | — | — |
| [After polymerization second stage] | | | | | | | |
| methanol (millimoles) | — | — | — | — | — | — | — |
| [After polymerization second stage] | | | | | | | |
| styrene (kg) | 0.86 | — | 0.90 | 1.50 | 2.20 | 0.65 | 1.25 |
| [Polymerization third stage] | | | | | | | |
| methanol (millimoles) | 114.6 | 344.8 | 180.0 | 257.6 | 312.0 | 155.9 | 243.0 |
| [After polymerization third stage] | | | | | | | |

TABLE 2

| | Production Examples | | | | | | | |
|---|---|---|---|---|---|---|---|---|
| | 1 | 2 | 3 | 4 | 5 | 6 | 7 | 8 |
| Block copolymer A | | | | | | | | |
| Relatively small weight average molecular weight of styrene block Ar1 [Mw(Ar1a)] | 9000 | 9000 | 9100 | 9000 | 10000 | 9000 | 9000 | 12000 |
| Relatiely large weight average molecular weight of styrene block Ar2 [Mw(Ar2a)] | 34000 | 26000 | 94000 | 56000 | 153000 | 123000 | 57000 | 100000 |
| Mw(Ar2a)/Mw(Ar1a) | 3.8 | 2.9 | 10.3 | 6.2 | 15.3 | 13.7 | 6.3 | 8.3 |
| Weight average molecular weight of isoprene block Da | 72000 | 68000 | 54000 | 57700 | 70000 | 62000 | 59000 | 123000 |
| Vinyl bond content of isoprene block Da (% by mol) | 22 | 60 | 25 | 30 | 7 | 7 | 7 | 9 |
| Weight average molecular weight of block copolymer A | 115000 | 103000 | 157100 | 122700 | 215000 | 198000 | 124000 | 235000 |
| Styrene unit content of block copolymer A (%) | 65 | 64 | 86 | 76 | 76 | 54 | 59 | 53 |
| Block copolymer B | | | | | | | | |
| Weight average molecular weight of styrene block Arb | 9000 | 9000 | 9100 | 9000 | 10000 | 9000 | 9000 | 12000 |
| Constituent of conjugated diene block copolymer B | isoprene | isoprene | isoprene | isoprene | isoprene | isoprene | isoprene | isoprene |
| Weight average molecular weight of conjugated diene block Db | 72000 | 68000 | 54000 | 57700 | 70000 | 62000 | 59000 | 123000 |
| Vinyl bond content of conjugated diene block Db (% bymol) | 22 | 60 | 25 | 30 | 7 | 7 | 7 | 9 |
| Weight average molecular weight of block copolymer B | 226800 | 215600 | 176400 | 186800 | 117000 | 284000 | 276000 | 147000 |
| Styrene unit content of block copolymer B (%) | 14 | 16 | 20 | 18 | 17 | 21 | 18 | 19 |
| Block copolymer A/ Block copolymer B (mass ratio) | 48/52 | 51/48 | 49/51 | 43/57 | 52/48 | 80/20 | 78/22 | 34/66 |
| Block copolymer C | | | | | | | | |
| Weight average molecular weight of styrene block Arc | 9000 | 9000 | 9100 | 9000 | 10000 | 9000 | 9000 | — |
| Weight average molecular weight of isoprene block Dc | 72000 | 68000 | 54000 | 57700 | 71000 | 62000 | 59000 | — |
| Rate relative to block copolymer composition overall (%) | 11 | 10 | 10 | 9 | 10 | 11 | 10 | 0 |
| Polymer component presumed to be block copolymer D | | | | | | | | |
| Weight average molecular weight | 295000 | — | 254000 | — | 230000 | 390000 | 320000 | — |
| Styrene unit content (%) | 27 | — | 37 | — | 55 | 43 | 38 | — |
| Rate relative to block copolymer composition overall (%) | 3 | — | 4 | — | 10 | 9 | 9 | 0 |
| Block copolymer composition (overall) | | | | | | | | |
| Weight average molecular weight | 168000 | 150000 | 142000 | 136000 | 149000 | 215000 | 128000 | 175000 |
| Styrene unit content (%) | 30 | 30 | 48 | 40 | 48 | 44 | 47 | 30 |
| Type A hardness | 43 | 41 | 64 | 55 | 65 | 61 | 68 | 62 |
| Anisotropic index | 1.1 | 1.2 | 1.1 | 1.3 | 1.1 | 1.2 | 3.5 | 1.3 |

| | Production Examples | | | | | |
|---|---|---|---|---|---|---|
| | 9 | 10 | 11 | 12 | 13 | 14 |
| Block copolymer A | | | | | | |
| Relatively small weight average molecular weight of styrene block Ar1 [Mw(Ar1a)] | — | — | — | — | 15000 | — |
| Relatively large weight average molecular weight of styrene block Ar2 [Mw(Ar2a)] | — | — | — | — | 76000 | — |

TABLE 2-continued

| | | | | | | |
|---|---|---|---|---|---|---|
| Mw(Ar2a)/Mw(Ar1a) | — | — | — | — | 5.1 | — |
| Weight average molecular weight of isoprene block Da | — | — | — | — | 133000 | — |
| Vinyl bond content of isoprene block Da (% by mol) | — | — | — | — | 7 | — |
| Weight average molecular weight of block copolymer A | — | — | — | — | 224000 | — |
| Styrene unit content of block copolymer A (%) | — | — | — | — | 48 | — |
| Block copolymer B | | | | | | |
| Weight average molecular weight of styrene block Arb | 11000 | 10000 | 13000 | 15000 | — | 11000 |
| Constituent of conjugated diene block copolymer B | isoprene | isoprene | isoprene | isoprene | — | butadiene |
| Weight average molecular weight of conjugated diene block Db | 70000 | 50000 | 45000 | 30000 | — | 50000 |
| Vinyl bond content of conjugated diene block Db (% by mol) | 7 | 7 | 7 | 7 | — | 11 |
| Weight average molecular weight of block copolymer B | 270000 | 120000 | 116000 | 90000 | — | 125000 |
| Styrene unit content of block copolymer B (%) | 19 | 18 | 30 | 44 | — | 25 |
| Block copolymer A/Block copolymer B (mass ratio) | — | — | — | — | — | — |
| Block copolymer C | | | | | | |
| Weight average molecular weight of styrene block Arc | 11000 | — | — | — | — | — |
| Weight average molecular weight of isoprene block Dc | 71000 | — | — | — | — | — |
| Rate relative to block copolymer composition overall (%) | 28 | 0 | 0 | 0 | 0 | 0 |
| Polymer component presumed to be block copolymer D | | | | | | |
| Weight average molecular weight | — | — | — | — | — | — |
| Styrene unit content (%) | — | — | — | — | — | — |
| Rate relative to block copolymer composition overall (%) | 0 | 0 | 0 | 0 | 0 | 0 |
| Block copolymer composition (overall) | | | | | | |
| Weight average molecular weight | 214000 | 120000 | 116000 | 90000 | 224000 | 125000 |
| Styrene unit content (%) | 19 | 18 | 30 | 44 | 48 | 25 |
| Type A hardness | 44 | 46 | 53 | 92 | 98 | 62 |
| Anisotropic index | 2.5 | 2.2 | 6.5 | 1.8 | 1.5 | 7.5 |

Production Examples 2 to 4

Compositions of Production Examples 2 to 4 were collected in the same manner as in Production Example 1, except that the amounts of TMEDA, styrene, n-butyllithium, isoprene, tetramethoxysilane, and methanol were changed respectively as indicated in Table 1. The same measurements as in Production Example 1 were carried out for the block copolymer compositions for Production Examples 2 to 4. The results are presented in Table 2.

Production Example 5

The block copolymer composition of Production Example 5 was collected in the same manner as in Production Example 1, except that the 31.1 millimoles of tetramethoxysilane was replaced with 60.1 millimoles of dimethyldimethoxysilane, and the amounts of TMEDA, styrene, n-butyllithium, isoprene, and methanol were changed respectively as indicated in Table 1. The same measurements as in Production Example 1 were carried out for the block copolymer composition for Production Example 5. The results are presented in Table 2.

Production Examples 6 to 7

Compositions of Production Examples 6 to 7 were collected in the same manner as in Production Example 1, except that the amounts of TMEDA, styrene, n-butyllithium, isoprene, tetramethoxysilane, and methanol were changed respectively as indicated in Table 1. The same measurements as in Production Example 1 were carried out for the block copolymer compositions for Production Examples 6 to 7. The results are presented in Table 2.

Production Example 8

In a pressure-resistant reactor, 23.3 kg of cyclohexane, 0.8 millimoles of TMEDA, and 1.24 kg of styrene were introduced, and while the content was stirred at 40° C., 14. 1 millimoles of n-butyllithium was added thereto. Polymerization was carried out for one hour while the temperature was increased to 50° C. Next, 43.2 millimoles of n-butyllithium was added, sequentially 0.85 kg of styrene was continuously added over 30 minutes, and the polymerization was continued for one hour. The polymerization conversion ratio of styrene was 100%. Subsequently, 7.05 kg of isoprene was continuously added to the reactor over one hour while the temperature was controlled to be maintained at 50° C. to 60° C. After the addition of isoprene was completed, polymerization was carried out for another one hour. The polymerization conversion ratio of isoprene was 100%. Next, 0.86 kg of styrene was continuously added for 30 minutes, and after the addition of styrene was completed, polymerization was carried out for another one hour, and thus two kinds of styrene-isoprene-styrene block copolymer that served as a block copolymer A and a block copolymer B were formed. The polymerization conversion ratio of styrene was 100%. Thereafter, 114. 6 millimoles of methanol as a polymerization terminator was added thereto and mixed thoroughly therein, and thus the reaction was terminated. A portion of the reaction liquid thus obtained was taken, and the same measurements as in Production Example 1 were carried out. These values are presented in Table 2. Further operations were carried out in the same manner as in Production Example 1, and thus a block copolymer composition of Production Example 8 was collected.

Production Example 9

In a pressure-resistant reactor, 23.3 kg of cyclohexane, 2.6 millimoles of TMEDA, and 1.90 kg of styrene were introduced, and while the content was stirred at 40° C., 172.4 millimoles of n-butyllithium was added thereto. Polymerization was carried out for one hour while the temperature was increased to 50° C. The polymerization conversion ratio of styrene was 100%. Subsequently, 8.10 kg of isoprene was continuously added to the reactor over one hour while the temperature was controlled to be maintained at 50° C. to 60° C. After the addition of isoprene was completed, polymerization was carried out for another one hour. The polymerization conversion ratio of isoprene was 100%. Next, 34.5 millimoles of tetramethoxysilane was added thereto as a coupling agent, the coupling reaction was carried out for two hours, and thus, a branched styrene-isoprene-styrene block copolymer that served as a block copolymer B was formed. Thereafter, 344. 8 millimoles of methanol as a polymerization terminator was added to a solution in which the styrene-isoprene block copolymer including an active terminal remained, and mixed thoroughly; thus the reaction was terminated. A portion of the reaction liquid thus obtained was taken, and the same measurements as in Production Example 1 were carried out. These values are presented in Table 2. Further operations were carried out in the same manner as in Production Example 1, and thus a block copolymer composition of Production Example 9 was collected.

Production Example 10

In a pressure-resistant reactor, 23.3 kg of cyclohexane, 1.3 millimoles of TMEDA, and 0.90 kg of styrene were introduced, and while the content was stirred at 40° C., 90.0 millimoles of n-butyllithium was added thereto. Polymerization was carried out for one hour while the temperature was increased to 50° C. The polymerization conversion ratio of styrene was 100%. Subsequently, 8.20 kg of isoprene was continuously added to the reactor over one hour while the temperature was controlled to be maintained at 50° C. to 60° C. After the addition of isoprene was completed, polymerization was carried out for another one hour. The polymerization conversion ratio of isoprene was 100%. Thereafter, 0.90 kg of styrene was continuously added thereto over one hour while the temperature was controlled to be maintained at 50° C. to 60° C. After the addition of styrene was completed, polymerization was carried out for another one hour, and thus a styrene-isoprene-styrene block copolymer was formed. The polymerization conversion ratio of styrene was 100%. Thereafter, 180.0 millimoles of methanol as a polymerization terminator was added thereto and mixed thoroughly therein, and thus the reaction was terminated. A portion of the reaction liquid thus obtained was taken, and the same measurements as in Production Example 1 were carried out. These values are presented in Table 2. Further operations were carried out in the same manner as in Production Example 1, and thus a block copolymer composition of Production Example 10 was collected.

Production Examples 11 to 13

Block copolymer compositions of Production Examples 11 to 13 were collected in the same manner as in Production Example 10, except that the amounts of TMEDA, styrene, n-butyllithium, isoprene and methanol were changed respectively as indicated in Table 1. For the block copolymer compositions of Production Examples 11 to 13, the same measurements as in Production Example 1 were carried out. The results are presented in Table 2.

Production Example 14

The block copolymer composition of Production Examples 14 was collected in the same manner as in Production Example 10, except that the 8.20 kg of isoprene was replaced with 7.50 kg of butadiene, and the amounts of TMEDA, styrene, n-butyllithium, and methanol were changed respectively as indicated in Table 1. For the block copolymer composition of Production Example 14, the same measurements as in Production Example 1 were carried out. The results are presented in Table 2.

Example 1

Using a kneader, 100 parts of the block copolymer composition of Production Example 1, 10 parts of liquid polybutadiene (NISSO-PB-B-1000 from NIPPON SODA CO., LTD.), and 2 parts of 2,6-di-t-butyl-p-cresol were kneaded at 170° C. Sequentially, the kneading temperature was dropped to 130° C., and 5 parts of 1,4-butadioldiactylate, 5 parts of 1,6-hexandioldimethacrylate, 0.01 parts of methylhydroquinone, and 0.8 parts of benzoin iso-propyl ether were added thereto and kneaded to obtain a photosensitive composition for a flexographic plate of Example 1. For this photosensitive composition for a flexographic plate, a tensile elastic modulus, a tension set, abrasion resistance, ink-swelling resistance, and a gel content were measured. The results are represented in Table 3.

TABLE 3

| | | Example 1 | Example 2 | Example 3 | Example 4 | Comp. Ex. 1 | Comp. Ex. 2 | Comp. Ex. 3 |
|---|---|---|---|---|---|---|---|---|
| Blend (parts) | | | | | | | | |
| Block copolymer composition | Production Example 1 | 100 | — | — | — | — | — | — |
| | Production Example 2 | — | 100 | — | — | — | — | — |
| | Production Example 3 | — | — | 100 | — | — | — | — |
| | Production Example 4 | — | — | — | 100 | — | — | — |
| | Production Example 5 | — | — | — | — | 100 | — | — |
| | Production Example 6 | — | — | — | — | — | 100 | — |
| | Production Example 7 | — | — | — | — | — | — | 100 |

TABLE 3-continued

|  |  |  |  |  |  |  |  |
|---|---|---|---|---|---|---|---|
| Production Example 8 | — | — | — | — | — | — | — |
| Production Example 9 | — | — | — | — | — | — | — |
| Production Example 10 | — | — | — | — | — | — | — |
| Production Example 11 | — | — | — | — | — | — | — |
| Production Example 12 | — | — | — | — | — | — | — |
| Production Example 13 | — | — | — | — | — | — | — |
| Production Example 14 | — | — | — | — | — | — | — |
| Weight average molecular weight overall | 168000 | 150000 | 142000 | 136000 | 149000 | 255000 | 128000 |
| Styrene unit content overall (%) | 30 | 30 | 48 | 40 | 48 | 44 | 47 |
| Type A hardness | 43 | 41 | 64 | 55 | 65 | 61 | 68 |
| Properties |  |  |  |  |  |  |  |
| 100% tensile elastic modulus in vertical direction to melt flows (Mpa) | 0.82 | 1.10 | 1.68 | 1.37 | 1.44 | 1.25 | 1.22 |
| Tension set in vertical direction to melt flows (%) | 3 | 4 | 4 | 4 | 4 | 4 | 5 |
| 100% tensile elastic modulus in melt flow direction (Mpa) | 0.93 | 1.35 | 1.88 | 1.67 | 1.71 | 1.40 | 1.55 |
| Tension set in melt flow direction (%) | 4 | 6 | 6 | 5 | 5 | 5 | 7 |
| Rate of tensile elastic modulus melt flow direction/vertical direction to melt flows | 1.1 | 1.2 | 1.1 | 1.2 | 1.2 | 1.1 | 1.3 |
| Abrasion resistance (index) | 80 | 95 | 160 | 140 | 150 | 165 | 155 |
| Printing properties (gel content) (%) | 92 | 99 | 91 | 98 | 67 | 70 | 65 |
| Ink-swelling resistance (%) | 102 | 101 | 101 | 101 | 101 | 101 | 101 |

|  |  | Comp. Ex. 4 | Comp. Ex. 5 | Comp. Ex. 6 | Comp. Ex. 7 | Comp. Ex. 8 | Comp. Ex. 9 | Comp. Ex. 10 |
|---|---|---|---|---|---|---|---|---|
| Blend (parts) |  |  |  |  |  |  |  |  |
| Block copolymer composition | Production Example 1 | — | — | — | — | — | — | — |
|  | Production Example 2 | — | — | — | — | — | — | — |
|  | Production Example 3 | — | — | — | — | — | — | — |
|  | Production Example 4 | — | — | — | — | — | — | — |
|  | Production Example 5 | — | — | — | — | — | — | — |
|  | Production Example 6 | — | — | — | — | — | — | — |
|  | Production Example 7 | — | — | — | — | — | — | — |
|  | Production Example 8 | 100 | — | — | — | — | — | — |
|  | Production Example 9 | — | 50 | — | — | — | — | — |
|  | Production Example 10 | — | — | 50 | — | — | — | — |
|  | Production Example 11 | — | — | — | 100 | — | — | — |
|  | Production Example 12 | — | — | — | — | 100 | — | — |
|  | Production Example 13 | — | 50 | 50 | — | — | 100 | — |
|  | Production Example 14 | — | — | — | — | — | — | 100 |
| Weight average molecular weight overall |  | 175000 | 220000 | 172000 | 116000 | 90000 | 224000 | 125000 |
| Styrene unit content overall (%) |  | 30 | 34 | 33 | 30 | 44 | 48 | 25 |
| Type A hardness |  | 62 | 55 | 53 | 53 | 92 | 98 | 62 |
| Properties |  |  |  |  |  |  |  |  |
| 100% tensile elastic modulus in vertical direction to melt flows (Mpa) |  | 0.61 | 0.71 | 0.78 | 0.83 | 3.79 | 5.27 | 0.63 |
| Tension set in vertical direction to melt flows (%) |  | 5 | 4 | 2 | 5 | 14 | 60 | 8 |
| 100% tensile elastic modulus in melt flow direction (Mpa) |  | 1.10 | 0.75 | 0.89 | 3.71 | 4.95 | 6.53 | 2.30 |
| Tension set in melt flow direction (%) |  | 9 | 6 | 5 | 4.5 | 15 | 65 | 12 |
| Rate of tensile elastic modulus melt flow direction/vertical direction to melt flows |  | 1.8 | 1.1 | 1.1 | 1.2 | 1.3 | 12 | 3.7 |
| Abrasion resistance (index) |  | 90 | 105 | 100 | 85 | 150 | 170 | 90 |
| Printing properties (gel content) (%) |  | 72 | 71 | 75 | 70 | 43 | 35 | 90 |
| Ink-swelling resistance (%) |  | 103 | 106 | 106 | 107 | 101 | 101 | 110 |

Examples 2 to 4

Photosensitive compositions for a flexographic plate of Examples 2 to 4 were obtained in the same manner as in Example 1, except that the block copolymer composition to be used was changed to the block copolymer compositions of Production Examples 2 to 4. For these photosensitive composition for a flexographic plate of Examples 2 to 4, the same measurements as in Example 1 were carried out. The results are presented in Table 3.

Comparative Examples 1 to 10

Photosensitive compositions for a flexographic plate of Comparative Examples 1 to 10 were obtained in the same manner as in Example 1, except that the block copolymer composition to be used was changed to the block copolymer compositions of Production Examples 5 to 14. For these photosensitive composition for a flexographic plate of Comparative Examples 1 to 10, the same measurements as in Example 1 were carried out. The results are presented in Table 3.

Followings can be seen from Table 2 and Table 3. That is, the block copolymer composition for a flexographic plate (Production Examples 1 to 4) of the present invention had excellent flexibility and crosslinking properties, its anisotropy was small, and the photosensitive composition for a flexographic plate of the present invention obtained from the block copolymer composition for a flexographic plate of the present invention was provided with both low tension set and high abrasion resistance, which can be said it was excellent in rubber elasticity and abrasion resistance, and was further excellent in ink-swelling resistance and isotropy (Examples 1 to 4). In contrast, the block copolymer compositions (Production Examples 5 to 14), which did not fall under the block copolymer composition for a flexographic plate of the present invention, did not have enough of at least one of flexibility, crosslinking properties, and anisotropy, and when these block copolymer compositions were used, the balance of rubber elasticity and abrasion resistance was inferior, and anisotropy was expressed (Comparative Examples 1 to 10).

The invention claimed is:

1. A flexographic plate comprising a photosensitive composition for a flexographic plate comprising a block copolymer composition for a flexographic plate, an ethylenically unsaturated compound having a molecular weight of 5,000 or less, and a photopolymerization initiator, wherein:

the block copolymer composition for a flexographic plate includes a block copolymer A represented by the following general formula (A) and a block copolymer B represented by the following general formula (B), a content of aromatic vinyl monomer units relative to all monomer units constituting polymer components of the block copolymer composition for the flexographic plate is 18% to 70% by mass;

a type A hardness is 25 to 65; and an anisotropic index is 2.0 or less:

$$Ar1^b\text{-}D^a\text{-}Ar2^a \quad (A)$$

$$(Ar^b\text{-}D^b)_n\text{-}X \quad (B)$$

in the general formula (A) and the general formula (B), $Ar1^a$ and $Ar^b$ each represent an aromatic vinyl polymer block having a weight average molecular weight of 6,000 to 20,000; $Ar2^a$ represents an aromatic vinyl polymer block having a weight average molecular weight of 25,000 to 400,000, a ratio ($Mw(Ar2^a)/Mw(Ar1^a)$) of the weight average molecular weight of $Ar2^a$ and the weight average molecular weight of $Ar1^a$ is 2 to 20; $D^a$ and $D^b$ each represent a conjugated diene polymer block having a vinyl bond content of 21% to 70% by mol; X represents a single bond or a residue of coupling agent;

and n represents an integer of 2 or more.

2. The flexographic plate according to claim 1, wherein the content of aromatic vinyl monomer units relative to all monomer units constituting polymer components of the block copolymer composition for the flexographic plate is 20% to 70% by mass.

3. The flexographic plate according to claim 1, wherein a mass ratio (A/B) of the block copolymer A and the block copolymer B is 36/64 to 85/15.

4. The flexographic plate according to claim 1, wherein the block copolymer composition for a flexographic plate further includes a block copolymer C represented by the following general formula (C):

$$Ar^c\text{-}D^c \quad (C)$$

in the general formula (C), $Ar^c$ represents an aromatic vinyl polymer block having a weight average molecular weight of 6,000 to 20,000, and $D^c$ represents a conjugated diene polymer block having a vinyl bond content of 21% to 70% by mol.

5. The flexographic plate according to claim 1, wherein the block copolymer B is obtained by using a compound including two or more of at least one kind of functional group selected from an alkoxyl group, an ester group and an epoxy group in one molecule as a coupling agent.

* * * * *